United States Patent
Sen et al.

(10) Patent No.: US 12,253,575 B1
(45) Date of Patent: Mar. 18, 2025

(54) SYSTEMS AND METHODS FOR DETECTING FAILURE OF SPRING CONTACTS

(71) Applicant: WAYMO LLC, Mountain View, CA (US)

(72) Inventors: Yi-Heng Sen, San Jose, CA (US); Noah Lassar, Santa Cruz, CA (US)

(73) Assignee: Waymo LLC, Mountain View, CA (US)

( * ) Notice: Subject to any disclaimer, the term of this patent is extended or adjusted under 35 U.S.C. 154(b) by 61 days.

(21) Appl. No.: 17/859,255

(22) Filed: Jul. 7, 2022

(51) Int. Cl.
*G01R 31/68* (2020.01)
*G01R 1/07* (2006.01)
*H01R 12/70* (2011.01)
*H01R 12/71* (2011.01)
*H05B 3/84* (2006.01)

(52) U.S. Cl.
CPC .............. *G01R 31/68* (2020.01); *G01R 1/07* (2013.01); *H05B 3/84* (2013.01); *H01R 12/7076* (2013.01); *H01R 12/714* (2013.01); *H05B 2203/016* (2013.01)

(58) Field of Classification Search
CPC . G01R 31/68; G01R 1/07; H05B 3/84; H05B 2203/016; H05B 3/86; H01R 12/7076; H01R 12/714
See application file for complete search history.

(56) References Cited

U.S. PATENT DOCUMENTS

| | | | | |
|---|---|---|---|---|
| 3,732,533 A | * | 5/1973 | Epstein | G01S 15/87 367/90 |
| 5,449,047 A | * | 9/1995 | Schivley, Jr. | E21B 44/00 175/27 |
| 5,493,775 A | * | 2/1996 | Darekar | B23K 31/12 228/110.1 |
| 10,775,350 B2 | * | 9/2020 | Zhang | G01N 29/2412 |
| 10,937,082 B2 | | 3/2021 | Edwards et al. | |
| 10,962,378 B2 | | 3/2021 | Cronin et al. | |
| 2007/0229248 A1 | * | 10/2007 | Mott | G01H 1/16 340/436 |
| 2017/0092099 A1 | * | 3/2017 | Walker | G01N 29/14 |
| 2019/0077377 A1 | * | 3/2019 | Schmidt | B60S 1/0848 |
| 2019/0094660 A1 | * | 3/2019 | Furutake | G02B 13/18 |
| 2020/0072793 A1 | * | 3/2020 | Zhang | G01N 29/2412 |
| 2020/0100367 A1 | * | 3/2020 | Antaya | G01S 7/027 |

(Continued)

FOREIGN PATENT DOCUMENTS

DE            10123499 A1 *   2/2002   ............ B23Q 17/20
DE     102017213079 A1 *   1/2019

*Primary Examiner* — Daniel R Miller
(74) *Attorney, Agent, or Firm* — Botos Churchill IP Law LLP

(57) ABSTRACT

Systems and methods for monitoring and detecting partial or full mechanical failures of a spring contact configured to provide an electrical connection between two elements. In some examples, a spring contact may be arranged between a first element, such as a window or cover of an operational sensor, and a second element, such as a printed circuit board. The window or cover may have an electrical element with a first electrical contact, and the printed circuit board may be attached to the spring contact via a joint (e.g., solder, weld, adhesive). A processing system may be configured to determine a state of the joint based on vibrations sensed by one or more vibration sensors attached to the second element.

23 Claims, 16 Drawing Sheets

(56) References Cited

U.S. PATENT DOCUMENTS

2020/0238922 A1\* 7/2020 Fujisaki ................. G03B 17/08
2020/0294401 A1   9/2020 Kerecsen
2021/0028571 A1\* 1/2021 Kitade .................... B60R 16/03
2021/0043997 A1\* 2/2021 Imeson ................ H01Q 1/1271
2021/0331650 A1\* 10/2021 Halmos .............. G02B 27/0006

\* cited by examiner

602

Monitor a plurality of outputs from one or more vibration sensors of an apparatus, the apparatus comprising:
- a first element;
- a first electrical contact attached to the first element;
- a second element remote from the first element, the one or more vibration sensors being coupled to the second element;
- one or more operational sensors, the one or more operational sensors being configured to detect objects in an environment around the system via one or more operational wavelengths, wherein the first element is substantially transparent to the operational wavelengths of the one or more sensors;
- a second electrical contact, the second electrical contact being a spring contact configured to press against the second element and at least a portion of the first electrical contact; and
- a joint configured to attach a first portion of the second electrical contact to the second element

604

Determine, based on one or more outputs of the plurality of outputs and one or more reference values, a state of the joint and/or a state of contact between the second electrical contact and the first electrical contact

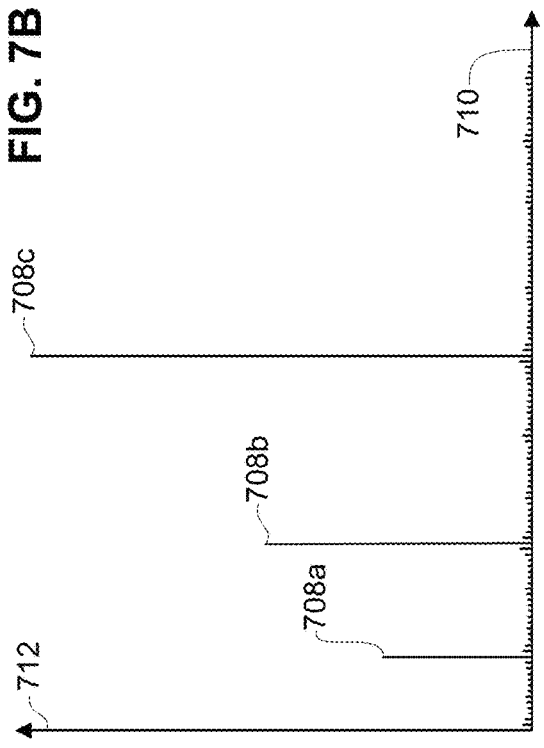
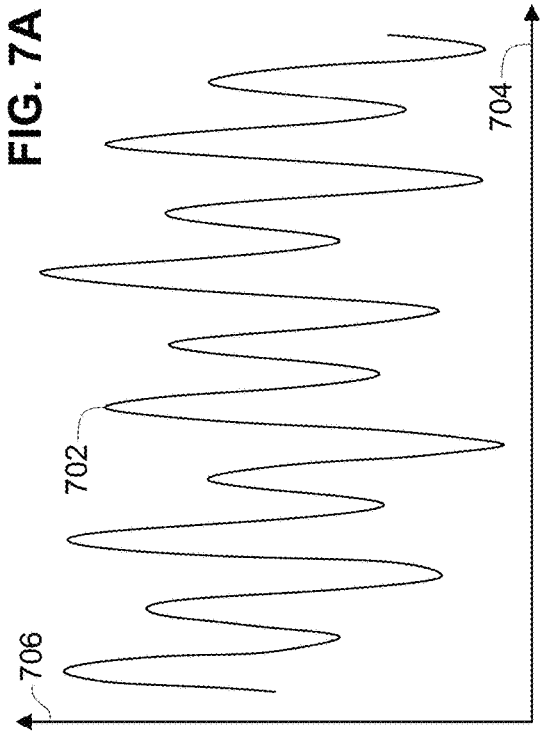
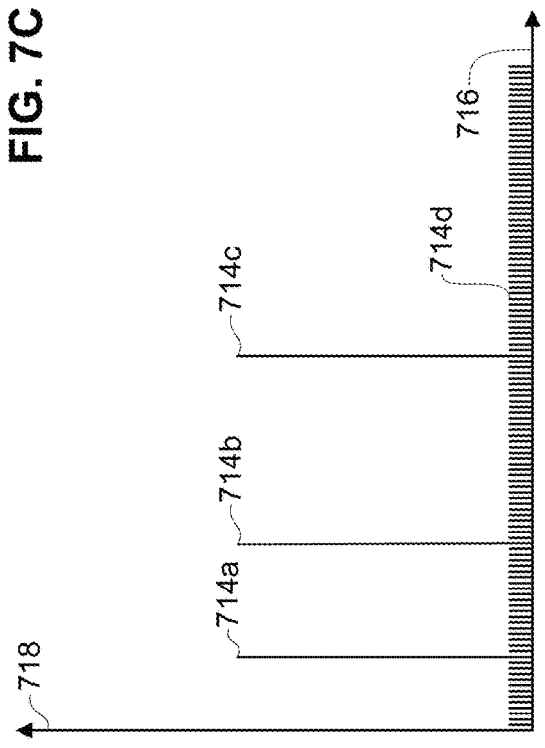
FIG. 7A
FIG. 7B
FIG. 7C

SYSTEMS AND METHODS FOR DETECTING FAILURE OF SPRING CONTACTS

BACKGROUND

Autonomous vehicles, for instance, vehicles that may not require a human driver in certain driving situations, may rely upon a variety of different externally mounted operational sensors such as cameras, radar, and lidar, which are configured to detect objects in the environment around the vehicle. Such operational sensors may be housed behind windows or within protective covers configured to protect the sensors from damage, exposure to weather, etc. However, the performance of such operational sensors may nevertheless be hindered if their respective windows or covers become occluded by moisture, ice, snow, and/or dirt. As a result, some housings may be configured to heat their respective window or cover in order to melt ice and snow, and prevent condensation and/or moisture build-up. If the heating element fails, then the sensors may become unusable, which may prevent the vehicle from operating autonomously.

BRIEF SUMMARY

The present technology concerns systems and methods for monitoring and detecting partial or full mechanical failures of a spring contact configured to provide an electrical connection between two elements, such as elements of a heating module for a cover of an operational sensor of an autonomous vehicle. For example, a spring contact may be arranged between a first element, such as a window or cover of an operational sensor configured to detect objects in a vehicle's environment, and a second element, such as a printed circuit board ("PC board"). The window or cover may be transparent (or substantially transparent, e.g., at least 75% transparent) to one or more frequency bands. By way of example, for an optical sensor such as a camera, the window or cover may be substantially transparent between 380 nm-700 nm. Likewise, the window or cover for a lidar sensor may be substantially transparent for wavelengths on the order of 905 nm and/or 1550 nm. Further, a radar sensor may operate in the 76-77 GHz band, so the window or cover for such a sensor may be substantially transparent at corresponding wavelengths, e.g., on the order of 3.9 mm.

The window or cover may also have an electrical element (e.g., an attached heater having a layer of indium tin oxide (ITO) covered with one or more metallic layers) with an associated first electrical contact, and the PC board may be attached to a second electrical contact via a joint (e.g., solder, weld, adhesive). For example, the second electrical contact may be a spring contact configured to press against both the PC board and at least a portion of the first electrical contact. In addition, one or more vibration sensors (e.g., accelerometers, strain gauges, acoustic vibration sensors) may be attached to the PC board and configured to sense vibrations propagating through the PC board and the attached second electrical contact.

In some aspects of the technology, a processing system may be configured to determine a state of the joint based on the vibrations sensed by the one or more vibration sensors. For example, the processing system may be configured to determine that the joint is intact, partially broken, or fully broken. Likewise, in some aspects, the processing system may be configured to determine a state of contact between the second electrical contact and the first electrical contact based on these sensed vibrations. For example, the processing system may be configured to determine whether the second electrical contact is, or is not, pressing against at least a portion of the first electrical contact.

Advantageously, the present technology provides systems and methods which may be used to assess the physical integrity of a spring contact without the need for disassembling a device to visually inspect and/or test the spring contact. For example, the present technology may be used to assess the integrity of a spring contact housed within a protective covering without requiring the cover to be removed. In addition, the present technology may also be used to continuously monitor the physical integrity of a spring contact while in use. For example, the present technology may be used to continuously monitor vibrations propagating through a sensor array on an autonomous vehicle as it drives, which may enable a system to detect a partial failure (e.g., a partial breakage in a solder joint, weld, or adhesive) before it results in a full loss of electrical connection. This early detection may enable the spring contact to be preemptively repaired or replaced. Likewise, in some aspects of the technology, upon detection of a failure, the processing system of the vehicle may select one or more fallback operating conditions. For example, potential fallback conditions may include continuing operation, relying on one or more other operational sensors to supplement or replace information received from the sensor associated with the failure, sending a request for service, or even causing the vehicle to switch from a fully autonomous driving mode to a partially-autonomous or manual driving mode.

In one aspect, the disclosure describes a system, comprising: a first element; a first electrical contact attached to the first element; a second element remote from the first element; one or more vibration sensors coupled to the second element; a second electrical contact, the second electrical contact being a spring contact configured to press against the second element and at least a portion of the first electrical contact; a joint configured to attach a first portion of the second electrical contact to the second element; and one or more processors configured to determine a state of the joint based on vibrations sensed by the one or more vibration sensors. In some aspects, the system further comprises one or more operational sensors, the one or more operational sensors being configured to detect objects in an environment around the system via one or more operational wavelengths, and the first element is substantially transparent to the operational wavelengths of the one or more operational sensors. In some aspects, the one or more vibration sensors comprise an accelerometer. In some aspects, the one or more vibration sensors comprise a strain gauge. In some aspects, the one or more vibration sensors comprise an acoustic vibration sensor. In some aspects, the first element is a window. In some aspects, the first electrical contact is integrated with a heating element attached to the window. In some aspects, the second element is a printed circuit board. In some aspects, the joint comprises solder. In some aspects, the joint comprises a weld. In some aspects, the joint comprises adhesive. In some aspects, the one or more processors being configured to determine the state of the joint includes being configured to determine that the joint is intact. In some aspects, the one or more processors being configured to determine the state of the joint includes being configured to determine that the joint is partially broken. In some aspects, the one or more processors being configured to determine the state of the joint includes being configured to determine that the joint is fully broken. In some aspects, the one or more processors are further configured to determine a state of contact between the second electrical contact and the first electrical contact based on vibrations sensed by the one or more vibration sensors. In some aspects, the one or more processors being configured to determine the state of contact includes being configured to determine that the second electrical contact is pressing against at least a portion of the first electrical contact. In some aspects, the one or more processors being configured to determine the state of contact includes being configured to determine that the second electrical contact is not pressing against any portion of the first electrical contact.

In another aspect, the disclosure describes a computer-implemented method, comprising: (1) monitoring, using one or more processors of a processing system, a plurality of outputs from one or more vibration sensors of an apparatus, the apparatus comprising: a first element; a first electrical contact attached to the first element; a second element remote from the first element, the one or more vibration sensors being coupled to the second element; a second electrical contact, the second electrical contact being a spring contact configured to press against the second element and at least a portion of the first electrical contact; and a joint configured to attach a first portion of the second electrical contact to the second element; and (2) determining, using the one or more processors, a state of the joint based on one or more outputs of the plurality of outputs and one or more reference values. In some aspects, the apparatus further comprises one or more operational sensors, the one or more operational sensors being configured to detect objects in an environment around the apparatus via one or more operational wavelengths, and the first element is substantially transparent to the operational wavelengths of the one or more operational sensors. In some aspects, the method further comprises determining, using the one or more processors, a state of contact between the second electrical contact and the first electrical contact based on the one or more outputs of the plurality of outputs and one or more reference values. In some aspects, determining the state of contact includes determining whether the second electrical contact is pressing against any portion of the first electrical contact.

In another aspect, the disclosure describes a computer-implemented method, comprising: (1) monitoring, using one or more processors of a processing system, a plurality of outputs from one or more vibration sensors of an apparatus, the apparatus comprising: a first element; a first electrical contact attached to the first element; a second element remote from the first element, the one or more vibration sensors being coupled to the second element; a second electrical contact, the second electrical contact being a spring contact configured to press against the second element and at least a portion of the first electrical contact; and a joint configured to attach a first portion of the second electrical contact to the second element; and (2) determining, using the one or more processors, a state of contact between the second electrical contact and the first electrical contact based on the one or more outputs of the plurality of outputs and one or more reference values. In some aspects, the apparatus further comprises one or more operational sensors, the one or more operational sensors being configured to detect objects in an environment around the apparatus via one or more operational wavelengths, and the first element is substantially transparent to the operational wavelengths of the one or more operational sensors.

BRIEF DESCRIPTION OF THE DRAWINGS

FIG. 6 sets forth an exemplary method for monitoring a state of a spring contact, in accordance with aspects of the disclosure.

FIG. 7A illustrates an exemplary vibration signal plotted in the time domain, in accordance with aspects of the disclosure.

FIG. 7B illustrates an exemplary vibration signal plotted in the frequency domain, in accordance with aspects of the disclosure.

FIG. 7C illustrates an exemplary set of reference values plotted in the frequency domain, in accordance with aspects of the disclosure.

DETAILED DESCRIPTION

The present technology will now be described with respect to the following exemplary systems and methods. Reference numbers in common between the figures depicted and described below are meant to identify the same features.

Example Vehicle Systems

Figure 1A:
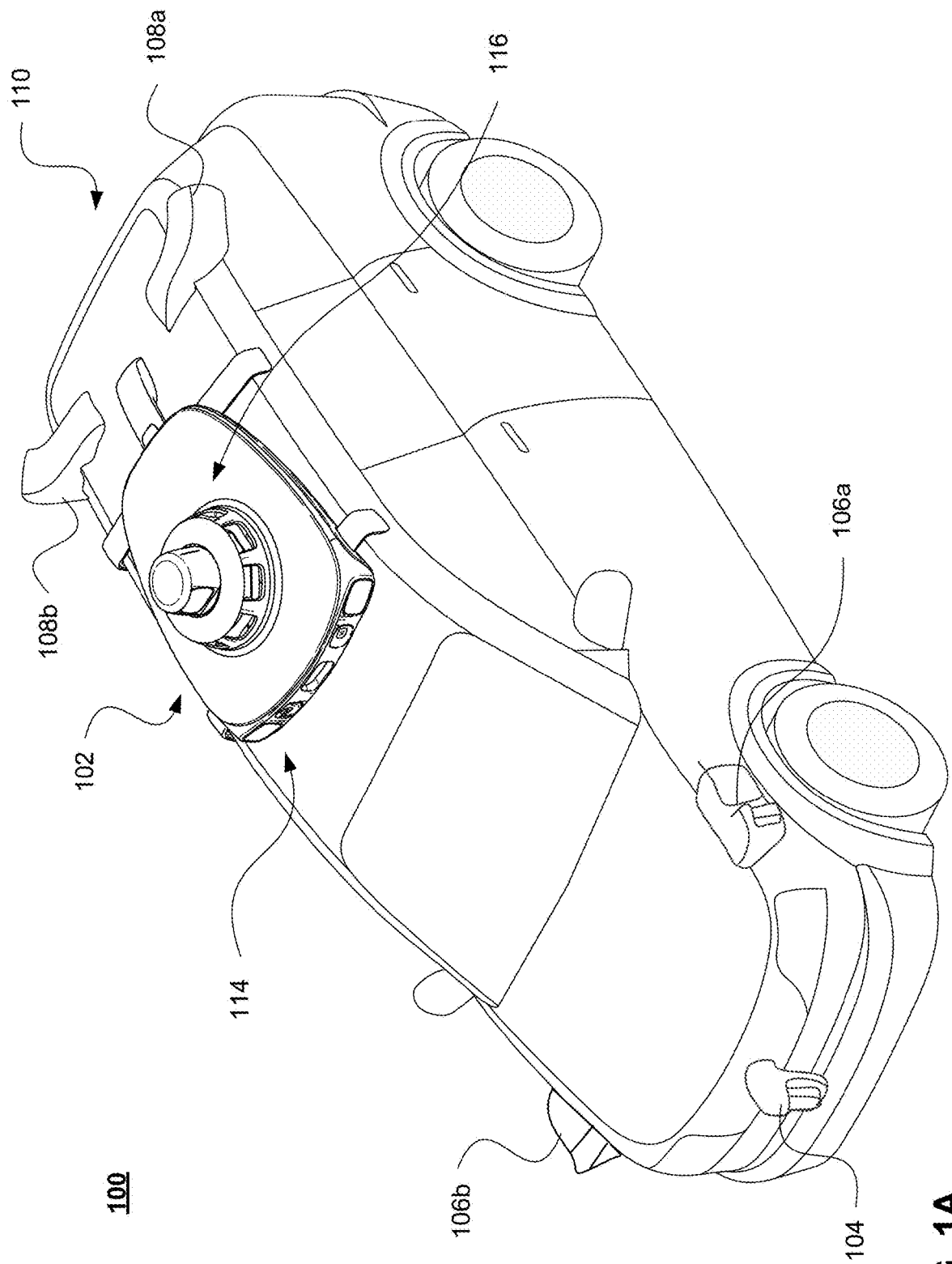
FIGS. 1A and 1B illustrate example autonomous vehicles, in accordance with aspects of the technology.
Figure 1B:
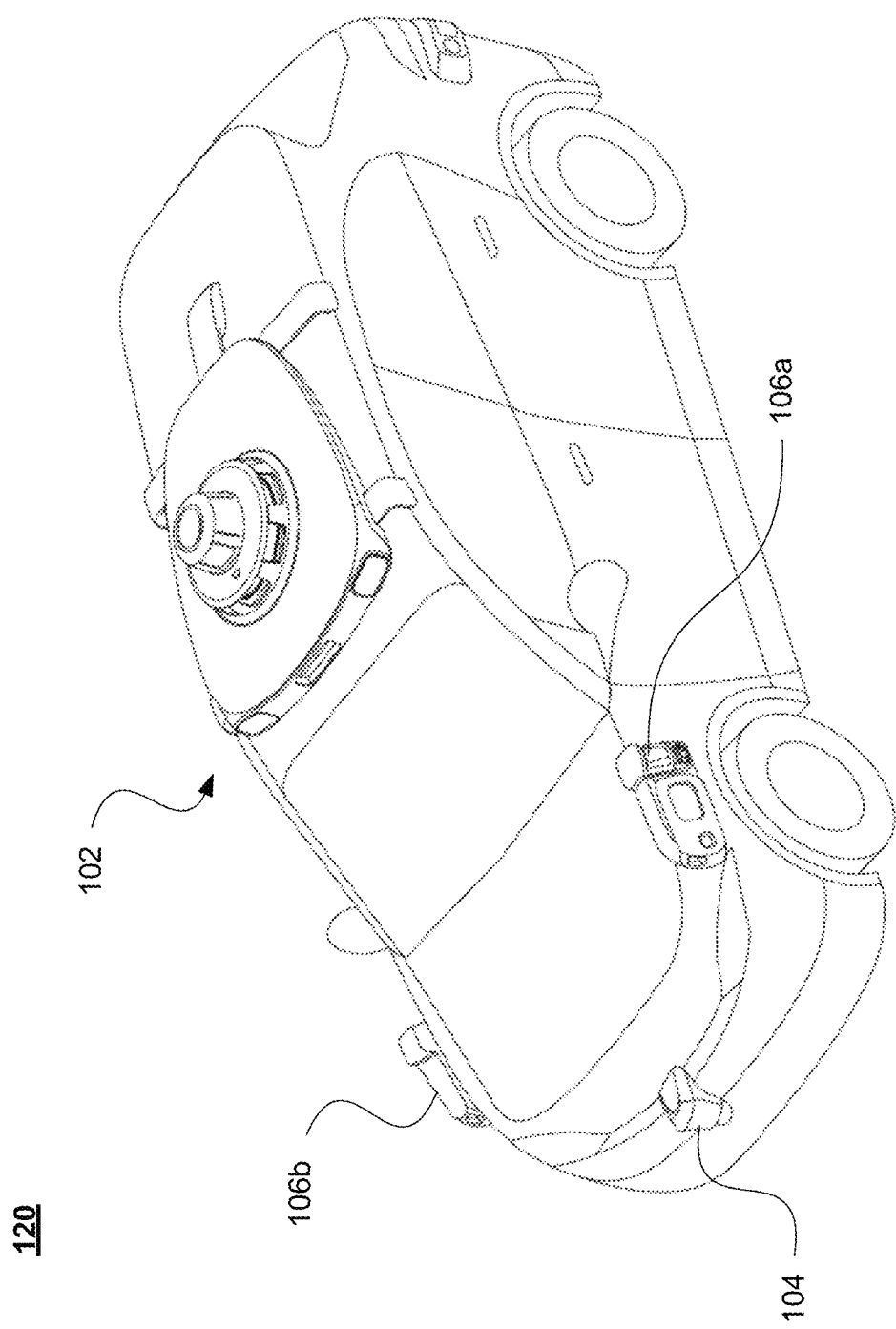
Figure 1C:
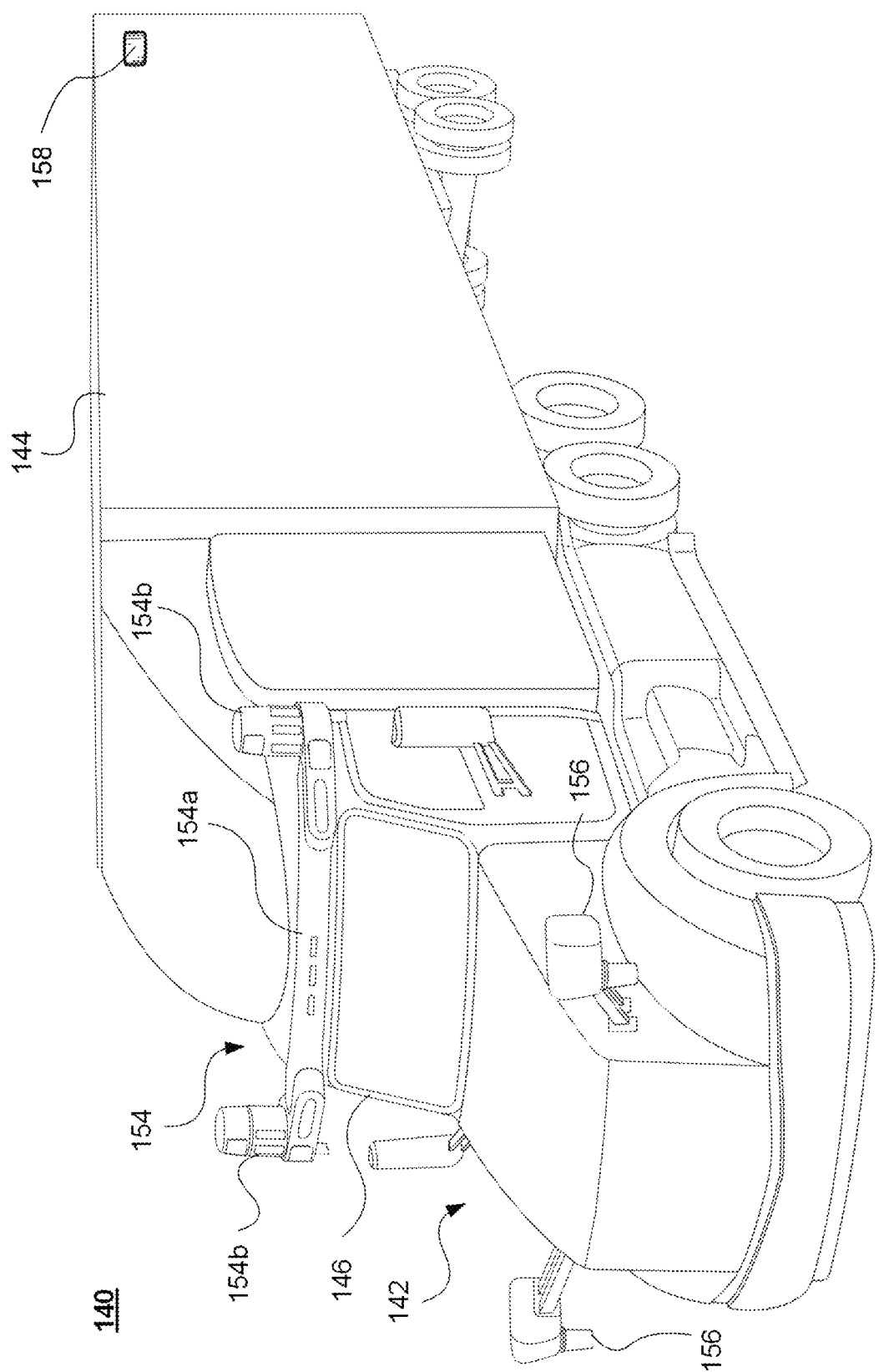
FIGS. 1C-1E illustrate example cargo and delivery type vehicles, in accordance with aspects of the technology.
Figure 1D:
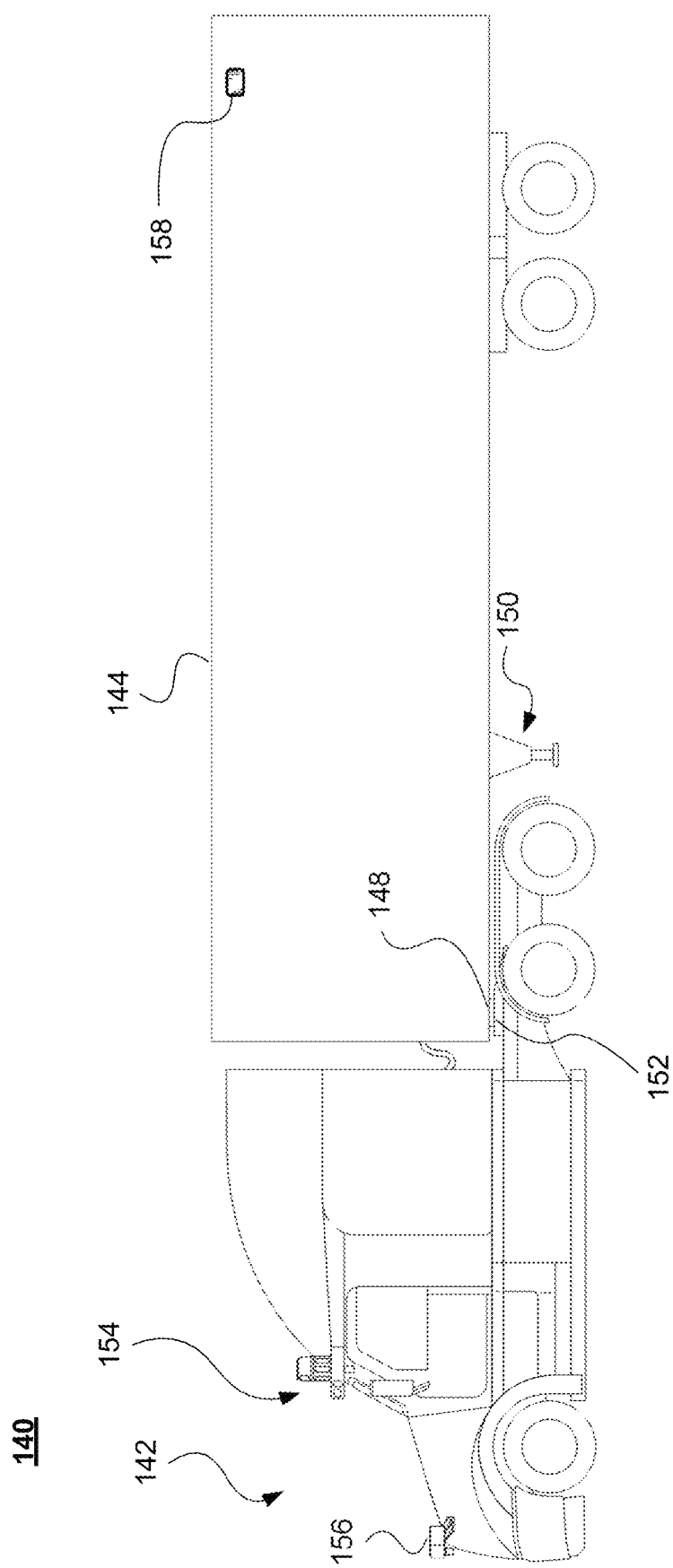
Figure 1E:
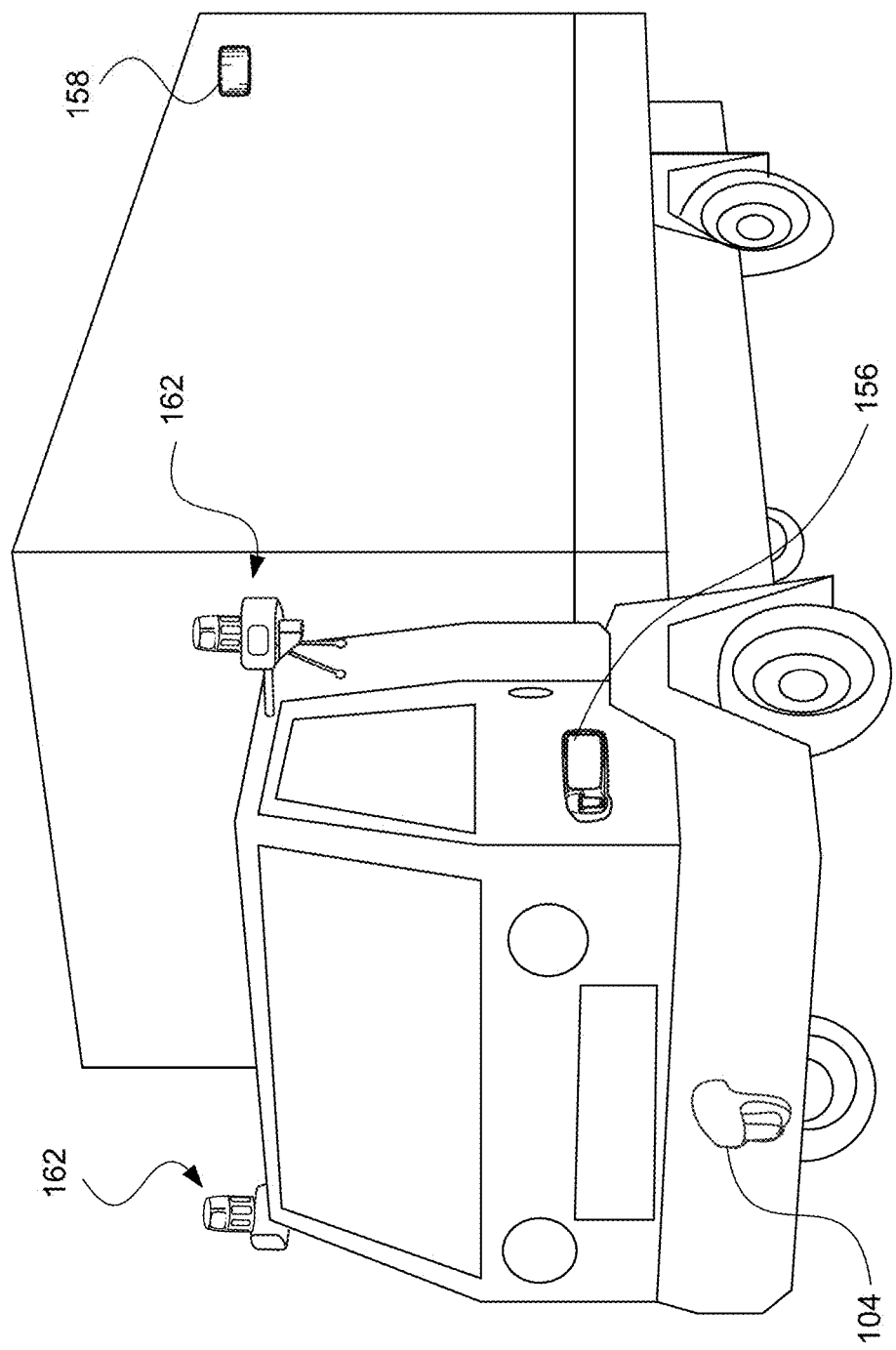

FIG. 1A illustrates a perspective view of an example passenger vehicle 100, such as a minivan or sport utility vehicle (SUV). FIG. 1B illustrates a perspective view of another example passenger vehicle 120, such as a sedan or crossover. The passenger vehicles may include various sensors for obtaining information about the vehicle's external environment. FIGS. 1C and 1D illustrate an example tractor-trailer type cargo vehicle 140. And FIG. 1E illustrates a smaller cargo vehicle 160, such as a panel truck for local deliveries. Each of these types of vehicles can be used in accordance with the technology described herein.

Vehicles, such as those discussed below, may be configured to operate in one or more different driving modes. For instance, in a manual driving mode, a driver may directly control acceleration, deceleration, and steering via inputs such as an accelerator pedal, a brake pedal, a steering wheel, etc. A vehicle may also operate in one or more autonomous driving modes including, for example, a semi-autonomous or partially autonomous driving mode in which a person exercises some amount of direct or remote control over driving operations, or a fully autonomous driving mode in which the vehicle handles the driving operations without direct or remote control by a person. These vehicles may be known by different names including, for example, autonomously driven vehicles, self-driving vehicles, and so on.

The U.S. National Highway Traffic Safety Administration (NHTSA) and the Society of Automotive Engineers (SAE) have each identified different autonomy levels to indicate how much, or how little, a vehicle controls the driving, although different organizations may categorize the levels differently. Moreover, such classifications may change (e.g., be updated) overtime.

As described herein, in a semi-autonomous or partially autonomous driving mode, even though the vehicle assists with one or more driving operations (e.g., steering, braking and/or accelerating to perform lane centering, adaptive cruise control, or emergency braking), the human driver is expected to be situationally aware of the vehicle's surroundings and supervise the assisted driving operations. Here, even though the vehicle may perform all driving tasks in certain situations, the human driver is expected to be responsible for taking control as needed. In contrast, in a fully autonomous driving mode, the control system of the vehicle performs all driving tasks and monitors the driving environment. This may be limited to certain situations such as operating in a particular service region or under certain time or environmental restrictions, or may encompass driving under all conditions without limitation. In a fully autonomous driving mode, a person is not expected to take over control of any driving operation.

Unless indicated otherwise, the architectures, components, systems and methods described herein can function in a semi-autonomous or partially autonomous driving mode, or a fully-autonomous driving mode. The technology may be employed in all manner of vehicles configured to operate in an autonomous driving mode, including vehicles that transport passengers or items such as food deliveries, packages, cargo, etc. While certain aspects of the disclosure may be particularly useful in connection with specific types of vehicles, the vehicle may be any type of vehicle including, but not limited to, cars, vans, motorcycles, cargo vehicles, buses, recreational vehicles, emergency vehicles, etc.

For instance, as shown in FIG. 1A, the vehicle may include a roof-top housing unit (roof pod assembly) 102 that may include one or more lidar sensors as well as various cameras (e.g., optical or infrared), radar units, acoustical sensors (e.g., microphone or sonar-type sensors, ultrasonic sensors, or the like), inertial (e.g., accelerometer, gyroscope, etc.) or other sensors (e.g., positioning sensors such as GPS sensors). Housing unit 102 may have any number of different configurations, such as domes, cylinders, "cake-top" shapes, etc. Housing 104, located at the front end of vehicle 100, and housings 106a. 106b on the driver's and passenger's sides of the vehicle may each incorporate lidar, radar, camera, acoustical and/or other sensors. For example, housing 106a may be located in front of the driver's side door along a quarter panel of the vehicle. As shown, the passenger vehicle 100 also includes housings 108a, 108b for, e.g., radar units, lidar and/or cameras also located towards the rear roof portion of the vehicle. Additional lidar, radar units and/or cameras (not shown) may be located at other places along the vehicle 100. For instance, arrow 110 indicates that a sensor unit (not shown) may be positioned along the rear of the vehicle 100, such as on or adjacent to the bumper. Depending on the vehicle type and sensor housing configuration(s), acoustical sensors may be disposed in any or all of these housings around the vehicle.

In this example, arrow 114 indicates that the roof pod 102 as shown includes a base section coupled to the roof of the vehicle. And arrow 116 indicates that the roof pod 102 also includes an upper section (e.g., with the dome, cylinder or cake-top shape) raised above the base section. Each of the base section and upper section may house different sensor units configured to obtain information about objects and conditions in the environment around the vehicle. The roof pod 102 and other sensor housings may also be disposed along vehicle 120 of FIG. 1B. By way of example, each sensor unit may include one or more sensors of the types described above, such as lidar, radar, camera (e.g., optical or infrared), acoustical (e.g., a passive microphone or active sound emitting sonar-type sensor), inertial (e.g., accelerometer, gyroscope, etc.) or other sensors (e.g., positioning sensors such as GPS sensors).

The example cargo vehicle 140 of FIGS. 1C and 1D is a tractor-trailer truck. The truck may include, e.g., a single, double or triple trailer, or may be another medium or heavy-duty truck such as in commercial weight classes 4 through 8. As shown, the truck includes a tractor unit 142 and a single cargo unit or trailer 144. The trailer 144 may be fully enclosed, open such as a flat bed, or partially open depending on the type of goods or other cargo to be transported. In this example, the tractor unit 142 includes the engine and steering systems (not shown) and a cab 146 for a driver and any passengers.

As seen in the side view of FIG. 1D, the trailer 144 includes a hitching point, known as a kingpin, 148, as well as landing gear 150 for when the trailer is detached from the tractor unit. The kingpin 148 is typically formed as a solid steel shaft, which is configured to pivotally attach to the tractor unit 142. In particular, the kingpin 148 attaches to a trailer coupling 152, known as a fifth-wheel, that is mounted rearward of the cab. For a double or triple tractor-trailer, the second and/or third trailers may have simple hitch connections to the leading trailer. Or, alternatively, each trailer may have its own kingpin. In this case, at least the first and second trailers could include a fifth-wheel type structure arranged to couple to the next trailer.

As shown, the tractor may have one or more sensor units 154 and 156 disposed therealong. For instance, sensor unit 154 may be disposed on a roof or top portion of the cab. The sensor unit 154 may be a sensor suite having an elongated central member 154a with one or more types of sensors located therealong (e.g., camera and/or radar modules) and side members 154b that may include other sensor types (e.g., short range lidar modules capable of detecting objects within 10-25 meters of the vehicle and/or long range lidar modules capable of detecting objects beyond 15-20 meters and up to 100-250 meters). Sensor units 156 may be disposed on left and/or right sides of the cab. Sensor units may also be located along other regions of the cab, such as along the front bumper or hood area, in the rear of the cab, adjacent to the fifth-wheel, underneath the chassis, etc. The trailer 154 may also have one or more sensor units 158 disposed therealong, for instance along one or both side panels, front, rear, roof and/or undercarriage of the trailer 154.

The perspective view 160 of FIG. 1E illustrates an example panel truck or other vehicle that may be suitable for local deliveries (e.g., groceries, meals, mail or other packages, etc.). Here, in contrast to the roof-top housing unit 154 shown in FIGS. 1C and 1D, the truck 160 may have a pair of sensor assemblies disposed in housings 162 on either side of the vehicle.

As with the sensor units of the passenger vehicles of FIGS. 1A and 1B, each sensor unit of the cargo vehicle may include one or more sensors, such as lidar, radar, camera (e.g., optical or infrared), acoustical (e.g., microphone or sonar-type sensor), inertial (e.g., accelerometer, gyroscope, etc.) or other sensors such as geolocation-based (e.g., GPS) positioning sensors, load cell or pressure sensors (e.g., piezoelectric or mechanical), or inertial (e.g., accelerometer, gyroscope, etc.).

Figure 2:
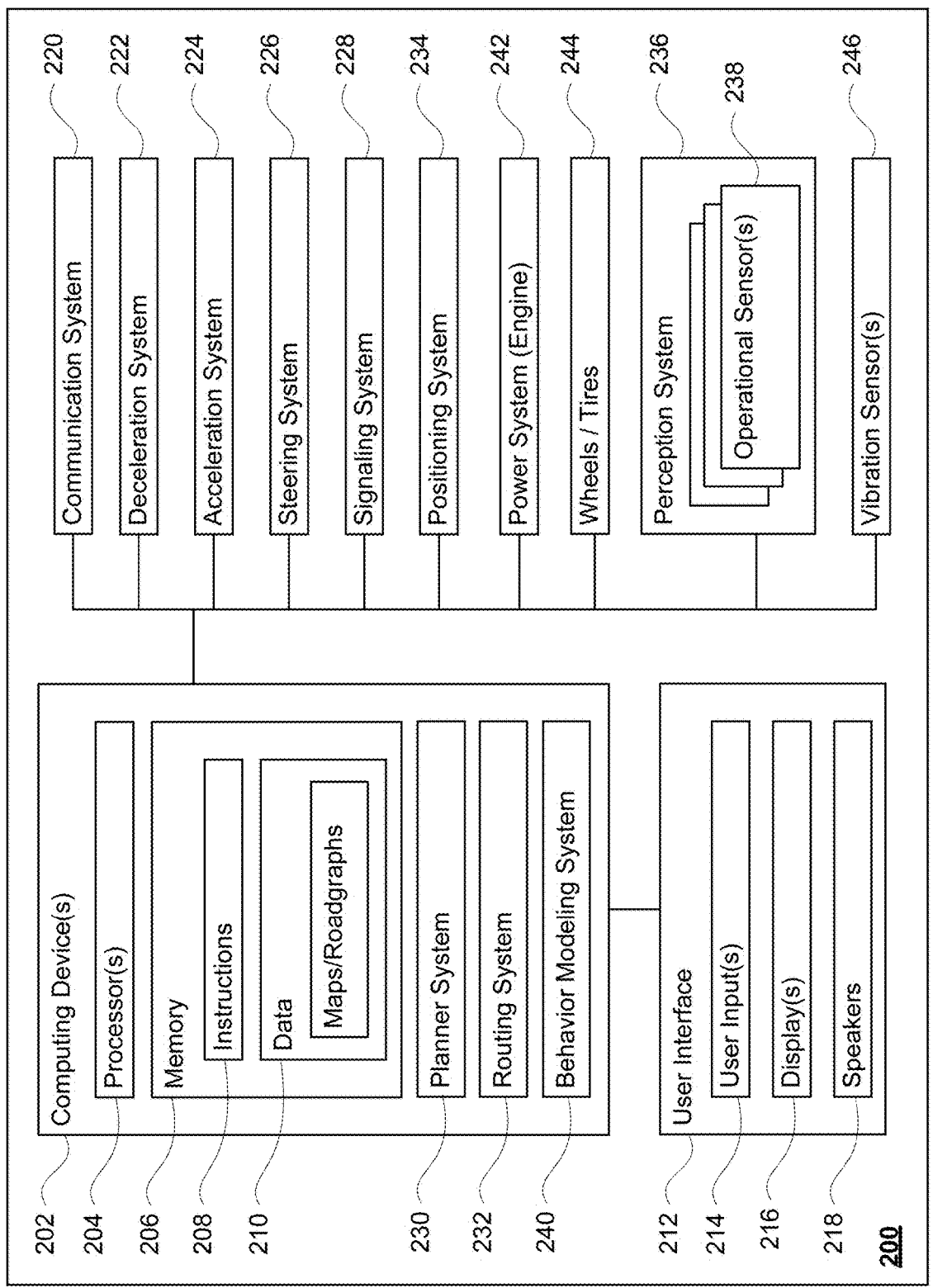
FIG. 2 is a block diagram illustrating exemplary components of an autonomous vehicle, in accordance with aspects of the technology.

As shown in system diagram 200 of FIG. 2, the vehicle such as vehicle 100, 120, or 160 may have one or more computing devices, such as computing device 202 containing one or more processors 204, memory 206 and other components typically present in general purpose computing devices.

The memory 206 stores information accessible by the one or more processors 204, including instructions 208 and data 210 that may be executed or otherwise used by the processor(s) 204. The memory 206 may be of any type capable of storing information accessible by the processor, including a computing device or computer-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The instructions 208 may be any set of instructions to be executed directly (such as machine code) or indirectly (such as scripts) by the processor. For example, the instructions may be stored as computing device code on the computing device-readable medium. In that regard, the terms "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

The data 210 may be retrieved, stored or modified by processor 204 in accordance with the instructions 208. For instance, although the claimed subject matter is not limited by any particular data structure, the data may be stored in computing device registers, in a relational database as a table having a plurality of different fields and records, XML documents or flat files. The data may also be formatted in any computing device-readable format.

The one or more processors 204 may be any conventional processors, such as commercially available CPUs, GPUs, or TPUs. Alternatively, the one or more processors may include a dedicated device such as an ASIC or other hardware-based processor. Although FIG. 2 functionally illustrates the processor, memory, and other elements of computing device 202 as being within the same block, it will be understood by those of ordinary skill in the art that the processor, computing device, or memory may actually include multiple processors, computing devices, or memories that may or may not be stored within the same physical housing. For example, memory may be a hard drive or other storage media located in a housing different from that of computing device 202. Accordingly, references to a processor or computing device will be understood to include references to a collection of processors or computing devices or memories that may or may not operate in parallel.

Computing devices 202 may include all of the components normally used in connection with a computing device such as the processor and memory described above as well as a user interface 212 having one or more user inputs 214 (e.g., one or more of a button, mouse, keyboard, touch screen, stylus, gesture input, and/or microphone), various electronic displays 216 (e.g., a monitor having a screen or any other electrical device that is operable to display information), and speakers 218 to provide information to a passenger of the autonomous vehicle or other people as needed. For example, electronic display 216 may be located within a cabin of autonomous vehicle 100, 120, or 160 and may be used by computing devices 202 to provide information to passengers or delivery personnel within the autonomous vehicle 100, 120, or 160.

Computing devices 202 may also include a communication system 220 having one or more wireless connections to facilitate communication with other computing devices, such as the client computing devices and server computing devices described in detail below. The wireless connections may include one or more short range communication protocols such as Bluetooth, Bluetooth low energy (LE), ultra-wideband (UWB), longer range cellular connections, as well as various configurations and protocols including the Internet, World Wide Web, intranets, virtual private networks, wide area networks, local networks, private networks using communication protocols proprietary to one or more companies, Ethernet, WiFi and HTTP, and various combinations of the foregoing.

Computing devices 202 may be part of an autonomous control system for the autonomous vehicle 100, 120, or 160 and may be capable of communicating with various components of the vehicle in order to control the vehicle in an autonomous driving mode. For example, computing devices 202 may be in communication with various systems of autonomous vehicle 1M, 120, or 160, such as deceleration system 222, acceleration system 224, steering system 226, signaling system 228, planning system 230 (also referred to as a planning/trajectory module), routing system 232, positioning system 234 (for determining the position of the vehicle such as its pose, e.g., position and orientation along the roadway or pitch, yaw, and roll of the vehicle chassis relative to a coordinate system), perception system 236 having one or more operational sensors 238, behavior modeling system 240 (also referred to as a behavior module), power system 242 (in order to control the movement, speed, etc. of autonomous vehicle 100, 120, or 160 in accordance with the instructions 208 of memory 206 in the autonomous driving mode), and one or more vibration sensors 246 (e.g., one or more accelerometers, strain gauges, acoustic vibration sensors, or other suitable transducers configured to sense vibrations propagating through selected spring contacts, circuit boards, or related structures, as described further below).

As an example, computing devices 202 may interact with deceleration system 222 and acceleration system 224 in order to control the speed of the vehicle. Similarly, steering system 226 may be used by computing devices 202 in order to control the direction of autonomous vehicle 100, 120, or 160. For example, if autonomous vehicle 100, 120, or 160 is configured for use on a road, such as a car or truck, steering system 226 may include components to control the angle of wheels 244 to turn the vehicle. Some or all of the wheels/tires 244 are coupled to deceleration, acceleration and/or steering systems. The computing devices 202 may be able to receive information about tire pressure, balance, and other factors that may impact driving in an autonomous mode. Computing devices 202 may also use the signaling system 228 in order to signal the vehicle's intent to other drivers or vehicles, for example, by lighting turn signals or brake lights when needed.

Routing system 232 may be used by computing devices 202 in order to generate a route to a destination using map information. Planning system 230 may be used by computing device 202 in order to generate short-term trajectories that allow the vehicle to follow routes generated by the routing system. In this regard, the planning system 230 and/or routing system 232 may store detailed map information, e.g., pre-stored, highly detailed maps identifying a road network including the shape and elevation of roadways, lane lines, intersections, crosswalks, bicycle lanes, speed limits, traffic signals, buildings, signs, real time traffic information (updated as received from a remote computing device, as such as the computing devices discussed below or other computing devices), pullover spots such as stopping or loading zones, vegetation, or other such objects and information. The map information may also include details about features adjacent to a roadway, such as curbs with or without ramps, as well as traffic or safety barriers, fences, etc.

The map information may be derived from satellite imagery and/or may be configured as a roadgraph. The roadgraph may include a plurality of graph nodes and edges representing features such as crosswalks, traffic lights, road signs, road or lane segments, etc., that together make up the road network of the map information. Each edge is defined by a starting graph node having a specific geographic location (e.g., latitude, longitude, altitude, etc.), an ending graph node having a specific geographic location (e.g., latitude, longitude, altitude, etc.), and a direction. This direction may refer to a direction the autonomous vehicle 100 must be moving in order to follow the edge (i.e., a direction of traffic flow). The graph nodes may be located at fixed or variable distances. The edges may represent driving along the same lane or changing lanes. Each node and edge may have a unique identifier, such as a latitude and longitude location of the node or starting and ending locations or nodes of an edge. In addition to nodes and edges, the map may identify additional information such as types of maneuvers required at different edges as well as which lanes are drivable.

The routing system 232 may use the aforementioned map information to determine a route from a current location (e.g., a location of a current node) to a destination. Routes may be generated using a cost-based analysis which attempts to select a route to the destination with the lowest cost. Costs may be assessed in any number of ways such as time to the destination, distance traveled (each edge may be associated with a cost to traverse that edge), types of maneuvers required, convenience to passengers or the vehicle, etc. Each route may include a list of a plurality of nodes and edges which the vehicle can use to reach the destination. Routes may be recomputed periodically as the vehicle travels to the destination.

The map information used for routing may be the same or a different map as that used for planning trajectories. For example, the map information used for planning routes not only requires information on individual lanes, but also the nature of lane boundaries (e.g., solid white, dash white, solid yellow, etc.) to determine where lane changes are allowed. However, unlike the map used for planning trajectories, the map information used for routing need not include other details such as the locations of crosswalks, traffic lights, stop signs, etc., though some of this information may be useful for routing purposes. For example, between a route with a large number of intersections with traffic controls (such as stop signs or traffic signal lights) versus one with no or very few traffic controls, the latter route may have a lower cost (e.g., because it is faster) and therefore may be preferable.

Positioning system 234 may be used by computing devices 202 in order to determine the vehicle's relative or absolute position on a map or on the earth. For example, the positioning system 234 may include a GPS receiver to determine the device's latitude, longitude, and/or altitude position based on information from "visible" satellites. By way of example, GPS utilizes at least 24 operational satellites in 6 orbital planes around the Earth. At any given location, at least 4 satellites may be in locations that can be detected by the GPS receiver. However, one or more of the satellites may not be visible to a given client device, for instance due to tall buildings or other structures (e.g., an indoor or below-ground parking garage) that may block or otherwise interfere with the RF signals transmitted by the satellites. Fewer visible satellites may translate into a reduction in GPS accuracy, or may prevent the client device being able to determine its location at all.

Other location systems such as laser-based localization systems, inertial-aided GPS, or camera-based localization may also be used to identify the location of the vehicle. The location of the vehicle may include information about an absolute geographical location (such as latitude, longitude, and altitude), a location of a node or edge of a roadgraph, as well as relative location information (such as location relative to other road users immediately around the vehicle), which can often be determined with less noise than an absolute geographical location.

The positioning system 234 may also include other devices in communication with computing devices 202, such as an accelerometer, gyroscope, or another direction/speed detection device to determine the direction and speed of the vehicle or changes thereto. By way of example only, an acceleration device may determine its pitch, yaw, or roll (or changes thereto) relative to the direction of gravity or a plane perpendicular thereto. The device may also track increases or decreases in speed and the direction of such changes. The device's provision of location and orientation data as set forth herein may be provided automatically to the computing devices 202, other computing devices and combinations of the foregoing.

The perception system 236 includes one or more components (operational sensors 238) for detecting objects external to the vehicle such as other road users (vehicles, pedestrians, bicyclists, etc.) obstacles in the roadway, traffic signals, signs, trees, buildings, etc. For example, the operational sensors 238 of the perception system 236 may include lidar, sonar, radar, cameras, microphones (e.g., in an acoustical array for instance arranged along the roof pod 102), pressure or inertial sensors, strain gauges, and/or any other detection devices that generate and/or record data which may be processed by the computing devices of computing devices 202. In the case where the vehicle is a passenger vehicle such as a minivan 100 or car 120, the vehicle may include lidar, cameras, and/or other sensors mounted on or near the roof, fenders, bumpers, or other convenient locations as shown in FIGS. 1A and 1B.

Such sensors of the perception system 236 may detect objects in the vehicle's external environment and their characteristics such as location, orientation (pose) relative to the roadway, size, shape, type (for instance, vehicle, pedestrian, bicyclist, etc.), heading, speed of movement relative to the vehicle, etc., as well as environmental conditions around the vehicle. The perception system 236 may also include other operational sensors within the vehicle to detect objects and conditions within the vehicle, such as in the passenger compartment or storage compartment (e.g., trunk). For instance, such sensors may detect one or more persons, pets, packages, etc., as well as conditions within and/or outside the vehicle such as temperature, humidity, etc. Still further, operational sensors 238 of the perception system 236 may measure the rate of rotation of the wheels 244, an amount or a type of braking by the deceleration system 222, and other factors associated with the equipment of the vehicle itself.

The raw data obtained by the operational sensors 238 (e.g., camera imagery, lidar point cloud data, radar return signals, acoustical information, etc.) can be processed by the perception system 236, positioning system 234 and/or sent for further processing to the computing devices 202 periodically or continuously as the data is generated by the perception system 236. Computing devices 202 may use the positioning system 234 to determine the vehicle's location and perception system 236 to detect and respond to objects and roadway information (e.g., signage or road markings) when needed to reach the location safely, such as by adjustments made by planner/trajectory module 230, including adjustments in operation to deal with sensor occlusions and other issues.

In some instances, object characteristics may be input into a behavior prediction system software module of the behavior modeling system 240 which uses various behavior models based on object type to output one or more predicted future behaviors for a detected object. Object trajectories may be a list of positions and orientations or headings (e.g., poses) as well as other predicted characteristics such as speed, acceleration or deceleration, rate of change of acceleration or deceleration, etc. In other instances, the characteristics obtained from the perception system 236 may be put into one or more detection system software modules, such as a traffic light detection system software module configured to detect the states of known traffic signals, construction zone detection system software module configured to detect construction zones from sensor data generated by the one or more sensors of the vehicle, as well as an emergency vehicle detection system and/or a pedestrian detection system configured to detect emergency vehicles and pedestrians from sensor data generated by sensors of the vehicle. Each of these detection system software modules may use various models to output a likelihood of a construction zone or an object being an emergency vehicle, a pedestrian or other type of object.

Detected objects, predicted future behaviors, various likelihoods from detection system software modules, the map information identifying the vehicle's environment, position information from the positioning system 234 identifying the location and orientation of the vehicle, a destination location or node for the vehicle, as well as feedback from various other systems of the vehicle may be input into a planning system software module of the planner system 230. The planner system 230 may use this input to generate trajectories for the vehicle to follow for some brief period of time into the future based on a route generated by a routing module of the routing system 232. In this regard, the trajectories may define the specific characteristics of acceleration, deceleration, speed, direction, etc. to allow the vehicle to follow the route towards reaching a destination. A control system software module of computing devices 202 may be configured to control movement of the vehicle, for instance by controlling braking, acceleration, and steering of the vehicle, in order to follow a trajectory.

The computing devices 202 may control the vehicle in one or more of the autonomous driving modes by controlling various components. For instance, by way of example, computing devices 202 may navigate the vehicle to a destination location completely autonomously using data from the detailed map information and planner system 230. Computing devices 202 may use the positioning system 234 to determine the vehicle's location and perception system 236 to detect and respond to objects when needed to reach the location safely. Again, in order to do so, computing device 202 and/or planner system 230 may generate trajectories and cause the vehicle to follow these trajectories, for instance, by causing the vehicle to accelerate (e.g., by supplying fuel or other energy to the engine or power system 242 by acceleration system 224), decelerate (e.g., by decreasing the fuel supplied to the engine or power system 242, changing gears, and/or by applying brakes by deceleration system 222), change direction (e.g., by turning the front or rear wheels of autonomous vehicle 100, 120, or 160 by steering system 226), and signal such changes (e.g., by lighting turn signals) using the signaling system 228. Thus, the acceleration system 224 and deceleration system 222 may be part of a drivetrain that includes various components between an engine of the vehicle and the wheels of the vehicle. Again, by controlling these systems, computing devices 202 may also control the drivetrain of the vehicle in order to maneuver the vehicle autonomously.

Figure 3A:
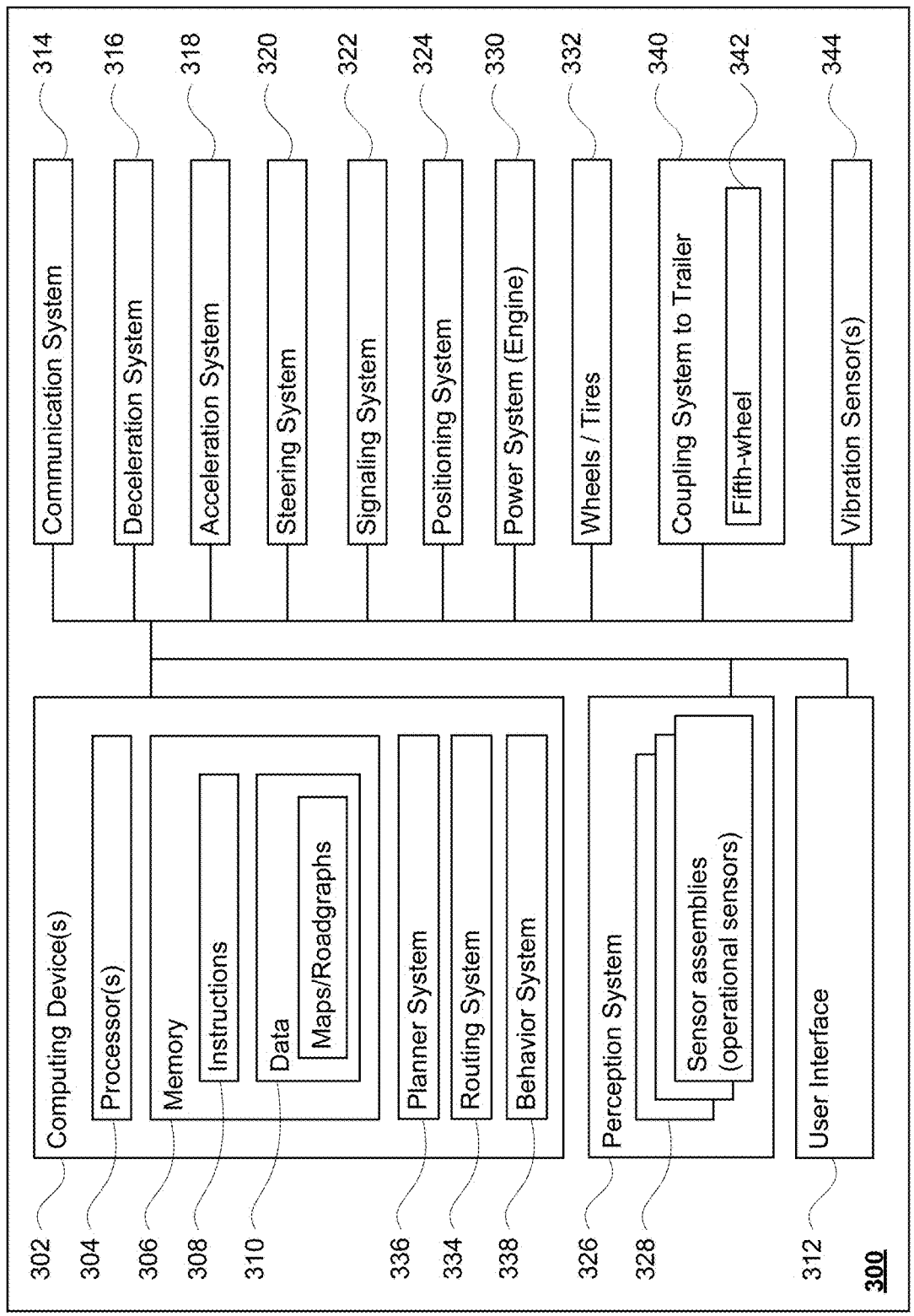
FIGS. 3A and 3B are block diagrams illustrating exemplary components of a cargo-type autonomous vehicle, in accordance with aspects of the technology.

FIG. 3A illustrates a block diagram 300 with various components and systems of a vehicle, e.g., vehicle 140 of FIGS. 1C and 1D. By way of example, the vehicle may be a truck, farm equipment, or construction equipment, configured to operate in one or more autonomous modes of operation. As shown in the block diagram 300, the vehicle includes a control system of one or more computing devices, such as computing devices 302 containing one or more processors 304, memory 306 and other components similar or equivalent to components 202, 204 and 206 discussed above with regard to FIG. 2. For instance, the data may include map-related information, e.g., roadgraphs.

The control system may constitute an electronic control unit (ECU) of a tractor unit of a cargo vehicle. As with instructions 208, the instructions 308 may be any set of instructions to be executed directly (such as machine code) or indirectly (such as scripts) by the processor. Similarly, the data 310 may be retrieved, stored or modified by one or more processors 304 in accordance with the instructions 308. Here, as above, the system may include a user interface 312 having one or more user inputs, various electronic displays, and speakers.

In one example, the computing devices 302 may form an autonomous driving computing system incorporated into vehicle 140. Similar to the arrangement discussed above regarding FIG. 2, the autonomous driving computing system of block diagram 300 may be capable of communicating with various components of the vehicle in order to perform route planning and driving operations. Communication system 314 may provide one or more wireless connections in the manner described above for communication system 220. In addition or alternatively, the communication system may include the vehicle's internal communication bus (e.g., a Controller Area Network (CAN) bus or a FlexRay bus).

For example, the computing devices 302 may be in communication with various systems of the vehicle, such as a driving system including a deceleration system 316, acceleration system 318, steering system 320, signaling system 322, and a positioning system 324, each of which may function as discussed above regarding equivalent elements in FIG. 2.

The computing devices 302 are also operatively coupled to a perception system 326 having one or more sensor assemblies 328, as well as a power system 330. Some or all of the wheels/tires 332 are coupled to the driving system, and the computing devices 202 may be able to receive information about tire pressure, balance, rotation rate and other factors that may impact driving in an autonomous mode. As with computing devices 202, the computing devices 302 may control the direction and speed of the vehicle by controlling various components. By way of example, computing devices 302 may navigate the vehicle to a destination location completely autonomously using data from the map information, routing system 334, planner system 336 and/or behavior system 338. For instance, computing devices 302 may employ a planner/trajectory module of the planner system 336 in conjunction with the positioning system 324, the sensor assemblies 328 of the perception system 326 and the routing system 334 to detect and respond to objects when needed to reach the location safely, similar to the manner described above for FIG. 2. In addition, the computing devices 302 are also in communication with one or more vibration sensors 344 (e.g., one or more accelerometers, strain gauges, acoustic vibration sensors, or other suitable transducers configured to sense vibrations propagating through selected spring contacts, circuit boards, or related structures, as described further below).

Similar to perception system 236, the perception system 326 also includes one or more operational sensors or other components such as those described above for detecting objects external to the vehicle, objects or conditions internal to the vehicle, and/or operation of certain vehicle equipment such as the wheels and driving system. Each sensor assembly 328 may include one or more operational sensors. In one example, a pair of sensor assemblies 328 may be arranged as sensor towers integrated into the side-view mirrors on the truck, farm equipment, construction equipment or the like. In another example, sensor assemblies 328 may also be positioned at different locations on the tractor unit 142 or on the trailer 144, as noted above with regard to FIGS. 1C and 1D. The computing devices 302 may communicate with the sensor assemblies 328 located on both the tractor unit 142 and the trailer 144. Each sensor assembly 328 may have one or more types of operational sensors such as those described above.

Also shown in FIG. 3A is a coupling system 340 for connectivity between the tractor unit and the trailer. The coupling system 340 may include one or more power and/or pneumatic connections (not shown), and a fifth-wheel 342 at the tractor unit for mechanical connection to the kingpin at the trailer.

Figure 3B:
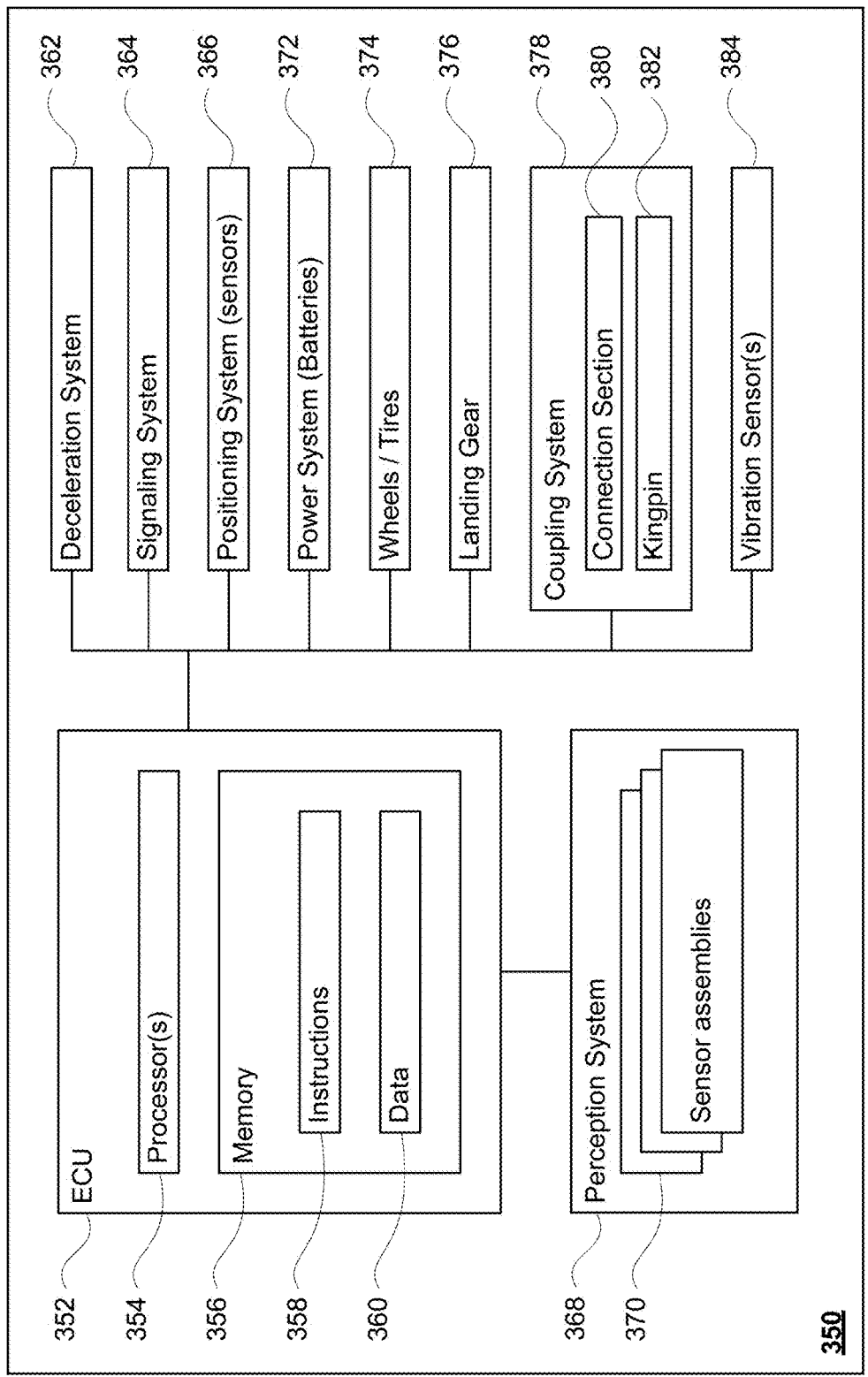

FIG. 3B illustrates a block diagram 350 of systems of an example trailer, such as trailer 144 of FIGS. 1C and 1D. As shown in this example, the system includes a trailer ECU 352 of one or more computing devices, such as computing devices containing one or more processors 354, memory 356, and other components typically present in general purpose computing devices. The memory 356 stores information accessible by the one or more processors 354, including instructions 358 and data 360 that may be executed or otherwise used by the processor(s) 354. The descriptions of the processors, memory, instructions and data from FIGS. 2 and 3A apply to these elements of FIG. 3B.

The trailer ECU 352 in this example is configured to receive information and control signals from the tractor unit, as well as information from various trailer components. The on-board processors 354 of the ECU 352 may communicate with various systems of the trailer, including a deceleration system 362, signaling system 364, and a positioning system 366. The ECU 352 may also be operatively coupled to a perception system 368 with one or more operational sensors arranged in sensor assemblies 370 for detecting objects in the trailer's driving environment. The ECU 352 may also be operatively coupled with a power system 372 (for example, a battery power supply) to provide power to local components. Some or all of the wheels/tires 374 of the trailer may be coupled to the deceleration system 362, and the processors 354 may be able to receive information about tire pressure, balance, wheel speed and other factors that may impact driving in an autonomous mode, and to relay that information to the processing system of the tractor unit. The deceleration system 362, signaling system 364, positioning system 366, perception system 368, power system 372 and wheels/tires 374 may operate in a manner such as described above with regard to FIGS. 2 and 3A. In addition, the ECU 352 is also in communication with one or more vibration sensors 384 (e.g., one or more accelerometers, strain gauges, acoustic vibration sensors, or other suitable transducers configured to sense vibrations propagating through selected spring contacts, circuit boards, or related structures, as described further below).

The trailer also includes a set of landing gear 376, as well as a coupling system 378. The landing gear may provide a support structure for the trailer when decoupled from the tractor unit. The coupling system 378, which may be a part of coupling system 340 of FIG. 3A, provides connectivity between the trailer and the tractor unit. Thus, the coupling system 378 may include a connection section 380 (e.g., for communication, power and/or pneumatic links to the tractor unit). In this example, the coupling system also includes a kingpin 382 configured for connectivity with the fifth-wheel of the tractor unit.

Figure 4A:
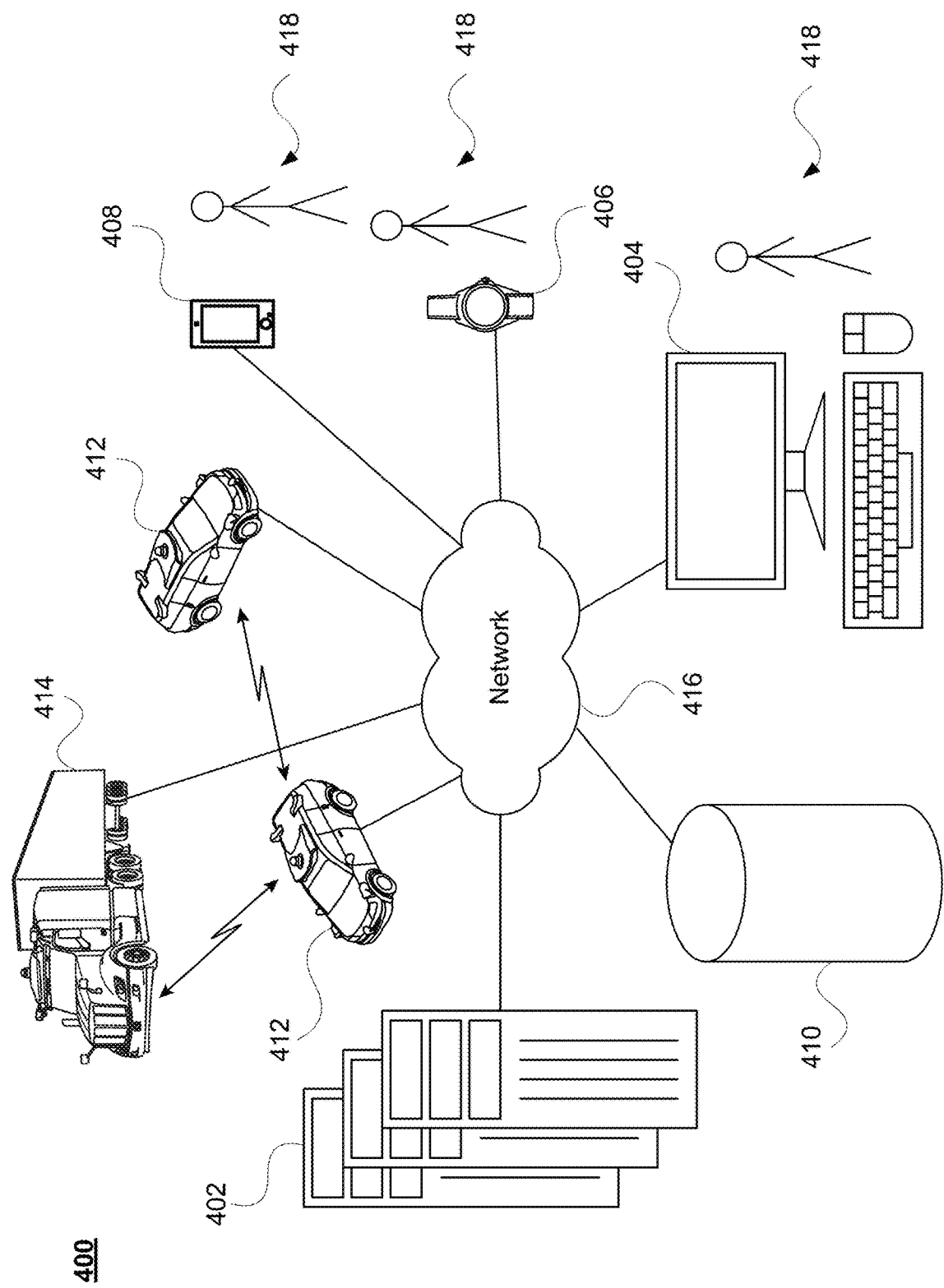
FIGS. 4A and 4B illustrate an example system for operating multiple vehicles in a fleet-type operation, in accordance with aspects of the technology.
Figure 4B:
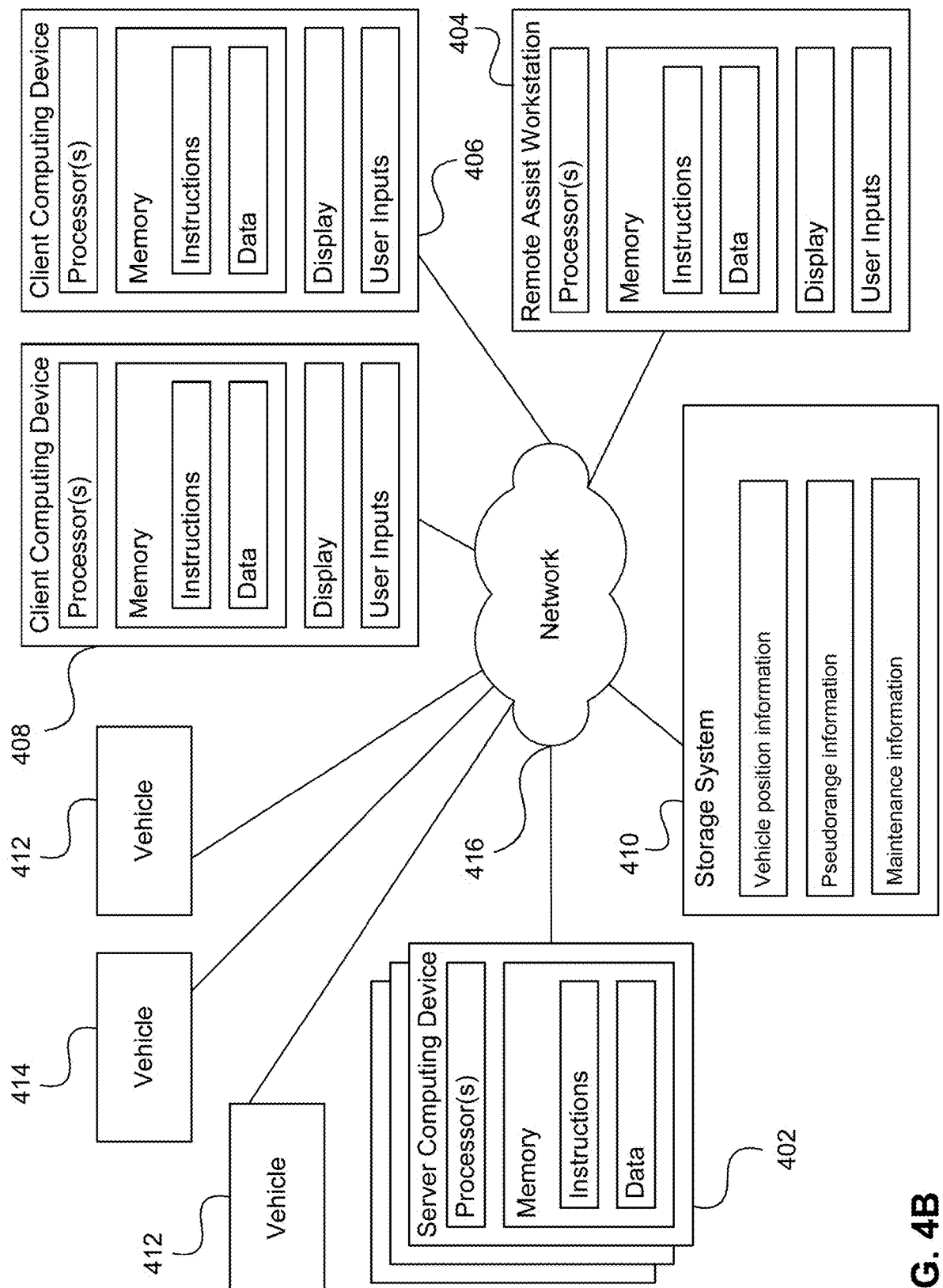

FIGS. 4A and 4B depict an example back-end system for operating multiple vehicles in a fleet-type operation. In particular, FIGS. 4A and 4B are pictorial and functional diagrams, respectively, of an example system 400 that includes a plurality of computing devices 402, 404, 406, 408 and a storage system 410 connected via a network 416. System 40) also includes vehicles 412 and 414 configured to operate in an autonomous driving mode, which may be configured the same as or similarly to vehicles 100, 120, 140 and/or 160 of FIGS. 1A-E. Vehicles 412 and/or vehicles 414 may be parts of one or more fleets of vehicles that provide rides for passengers or deliver meals, groceries, cargo, or other packages to customers. Although only a few vehicles and computing devices are depicted for simplicity, a typical system may include significantly more, such as tens or hundreds of vehicles. As shown in FIG. 4B, each of computing devices 402, 404, 406 and 408 may include one or more processors, memory, data and instructions. Such processors, memories, data and instructions may be configured similarly to the ones described above with regard to FIGS. 2, 3A, and/or 3B.

The various computing devices and vehicles may communicate directly or indirectly via one or more networks, such as network 416. The network 416 and any intervening nodes may include various configurations and protocols including short range communication protocols such as Bluetooth™, Bluetooth LE™ and UWB, the Internet, World Wide Web, intranets, virtual private networks, wide area networks, local networks, private networks using communication protocols proprietary to one or more companies, Ethernet, WiFi and HTTP, and various combinations of the foregoing. Such communication may be facilitated by any device capable of transmitting data to and from other computing devices, such as modems and wireless interfaces.

In one example, computing device 402 may include one or more server computing devices having a plurality of computing devices, e.g., a load-balanced server farm, that exchange information with different nodes of a network for the purpose of receiving, processing and transmitting the data to and from other computing devices. For instance, computing device 402 may include one or more server computing devices that are capable of communicating with the computing devices of vehicles 412 and/or 414, as well as computing devices 404, 406 and 408 via the network 416. For example, vehicles 412 and/or 414 may be a part of a fleet of autonomous vehicles that can be dispatched by a server computing device to various locations. In this regard, the computing device 402 may function as a dispatching server computing system which can be used to dispatch vehicles to different locations in order to pick up and drop off passengers or to pick up and deliver cargo or other items. In addition, server computing device 402 may use network 416 to transmit and present information to a rider or other user of one of the other computing devices. In this regard, computing devices 404, 406 and 408 may be considered client computing devices.

As shown in FIGS. 4A and 4B each client computing device 404, 406 and 408 may be a personal computing device intended for use by a respective user 418, and have all of the components normally used in connection with a personal computing device including a one or more processors (e.g., a central processing unit (CPU), graphics processing unit (GPU) and/or tensor processing unit (TPU)), memory (e.g., RAM and internal hard drives) storing data and instructions, a display (e.g., a monitor having a screen, a touch-screen, a projector, a television, or other device such as a smart watch display that is operable to display information), and user input devices (e.g., a mouse, keyboard, touchscreen or microphone). The client computing devices may also include a camera for recording video streams, speakers, a network interface device, and all of the components used for connecting these elements to one another.

Although the client computing devices may each comprise a full-sized personal computing device, they may alternatively comprise mobile computing devices capable of wirelessly exchanging data with a server over a network such as the Internet. By way of example only, client computing devices 406 and 408 may be mobile phones or devices such as a wireless-enabled PDA, a tablet PC, a wearable computing device (e.g., a smartwatch or HMD), or a netbook that is capable of obtaining information via the Internet or other networks.

In some examples, client computing device 404 may be a remote assistance or other fleet management workstation used by an administrator, rider support operator or other personnel to communicate with riders of dispatched vehicles. Although only a single remote assistance workstation 404 is shown in FIGS. 4A and 4B, any number of such workstations may be included in a given system. Moreover, although operations workstation is depicted as a desktop-type computer, operations workstations may include various types of personal computing devices such as laptops, netbooks, tablet computers, etc. By way of example, the remote assistance workstation may be used by a technician or other user to help guide a rider to the vehicle at the pickup location.

Storage system 410 can be of any type of computerized storage capable of storing information accessible by the server computing devices 402, such as a hard-drive, memory card, ROM, RAM, DVD. CD-ROM, flash drive and/or tape drive. In addition, storage system 410 may include a distributed storage system where data is stored on a plurality of different storage devices which may be physically located at the same or different geographic locations. Storage system 410 may be connected to the computing devices via the network 416 as shown in FIGS. 4A and 4B, and/or may be directly connected to or incorporated into any of the computing devices.

Storage system 410 may store various types of information. This can include current vehicle position information for the vehicles in the fleet, pseudorange information (e.g., error-related information) gathered by the vehicles' GPS receivers, maintenance information (e.g., information regarding expected or necessary repairs such as information derived from one or more vibration sensors mounted on the vehicles), etc. The storage system 410 may also store autonomous vehicle control software which is to be used by vehicles, such as vehicles 412 or 414, to operate such vehicles in an autonomous driving mode. The storage system 410 can also include route information, weather information, etc. This information may be shared with the vehicles 412 and 414, for instance to help with operating the vehicles in an autonomous driving mode, scheduling maintenance and repairs, etc.

Example Spring Contact Configurations

FIGS. 5A-5D illustrate various states of an example system incorporating a spring contact and a vibration sensor, in accordance with aspects of the technology. In that regard, in the example state 500-1 of FIG. 5A, the system includes a first element 502, and an electrical element attached to the first element. In this example, the electrical element is multi-layered, comprising a base layer 504c that is in direct contact with the first element, a middle layer 504b, and a top layer 504a configured to serve as or include a first electrical contact. As will be appreciated, in some aspects of the technology, the electrical element may not be multi-layered, or may have a different number of layers (e.g., 2, 4, 10, etc.).

In some aspects of the technology, the first element 502 may be a window or cover (e.g., comprising glass, polycarbonate, sapphire, silicon, etc.), and the base layer 504c may be an electrical heating element (e.g., a film or layer of Indium Tin Oxide ("ITO")) applied to a surface of the window or cover and configured to heat the window or cover to prevent build-up of ice and/or moisture. In such a case, the electrical element's middle layer 504b and top layer 504c may form a first electrical contact (e.g., a bus bar) configured to conduct electricity from the second electrical contact 506 to the base layer 504c. For example, in some aspects, the middle layer 504b may be a copper layer of a bus bar, and the top layer 504c may be a nickel layer of the bus bar.

Figure 5A:
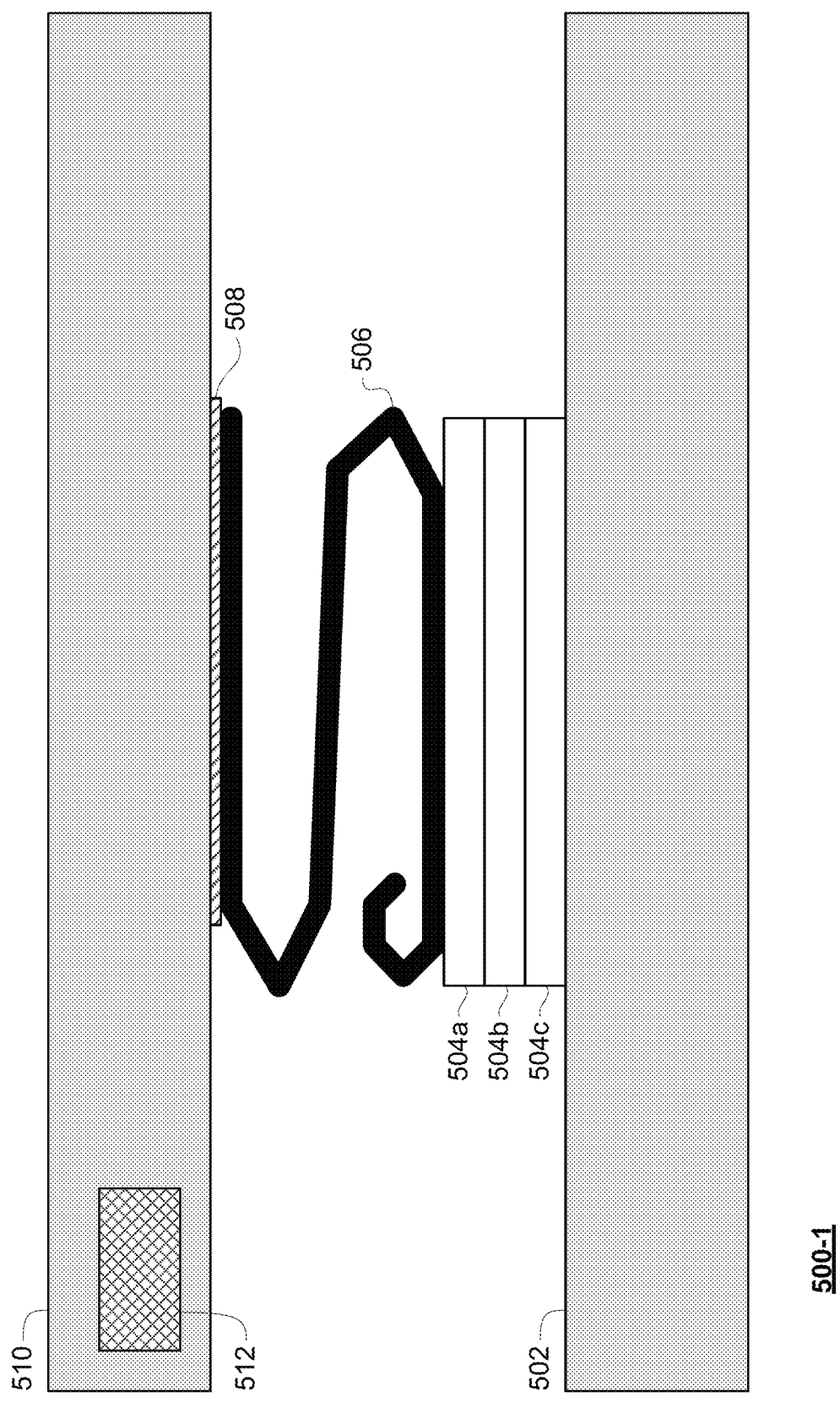
FIGS. 5A-5D illustrate various states of an example system incorporating a spring contact and a vibration sensor, in accordance with aspects of the technology.

Although not shown in the simplified example of FIG. 5A, the system may further include one or more operational sensors (e.g., operational sensors 238 of FIG. 2, the operational sensors within sensor assemblies 328 and 370 of FIGS. 3A and 3B, etc.), and the first element 502 may be a window or housing that is transparent or substantially transparent (such as 75-85% transparent or higher) to the operational wavelengths of the one or more operational sensors. For example, where the system includes an optical sensor such as a camera, the window or cover of the first element 502 may be substantially transparent for wavelengths between 380 nm and 700 nm. Likewise, where the system includes a lidar sensor, the window or cover of the first element 502 may be substantially transparent for wavelengths on the order of 905 nm and/or 1550 nm. Further, where the system includes a radar sensor configured to operate in the 76-77 GHz band, the window or cover of the first element 502 may be substantially transparent at corresponding wavelengths, e.g., on the order of 3.9 mm.

The system of FIG. 5A further includes a second electrical contact 506. In this example, the second electrical contact 506 is a spring contact configured to press against at least a portion of the first electrical contact (e.g., in the electrical element's top layer 504c) and at least a portion of a second element 508. Second element 510 may be any suitable structure on which the second electrical contact 506 may be mounted, such as a PC board, battery holder, etc. In FIG. 5A, a joint 508 is shown attaching a portion of the second electrical contact 506 to a portion of the second element 510. This joint may utilize any suitable joining method(s). For example, in some aspects, the joint 508 may be made by soldering, welding, gluing, taping, crimping, interleaving, and/or embedding a portion of the second electrical contact 506 onto or into a portion of the second element.

The system of FIG. 5A further includes one or more vibration sensors 512 coupled to the second element 510. The one or more vibration sensors 512 may include any suitable type of sensor capable of sensing vibrations propagating through the second element 510 and elements attached thereto, such as the second electrical contact 506. For example, in some aspects of the technology, the one or more vibration sensors 512 may include one or more accelerometers. Likewise, in some aspects, the one or more vibration sensors 512 may include one or more strain gauges. Further, in some aspects, the one or more vibration sensors 512 may include one or more acoustic vibration sensors.

Figure 5B:
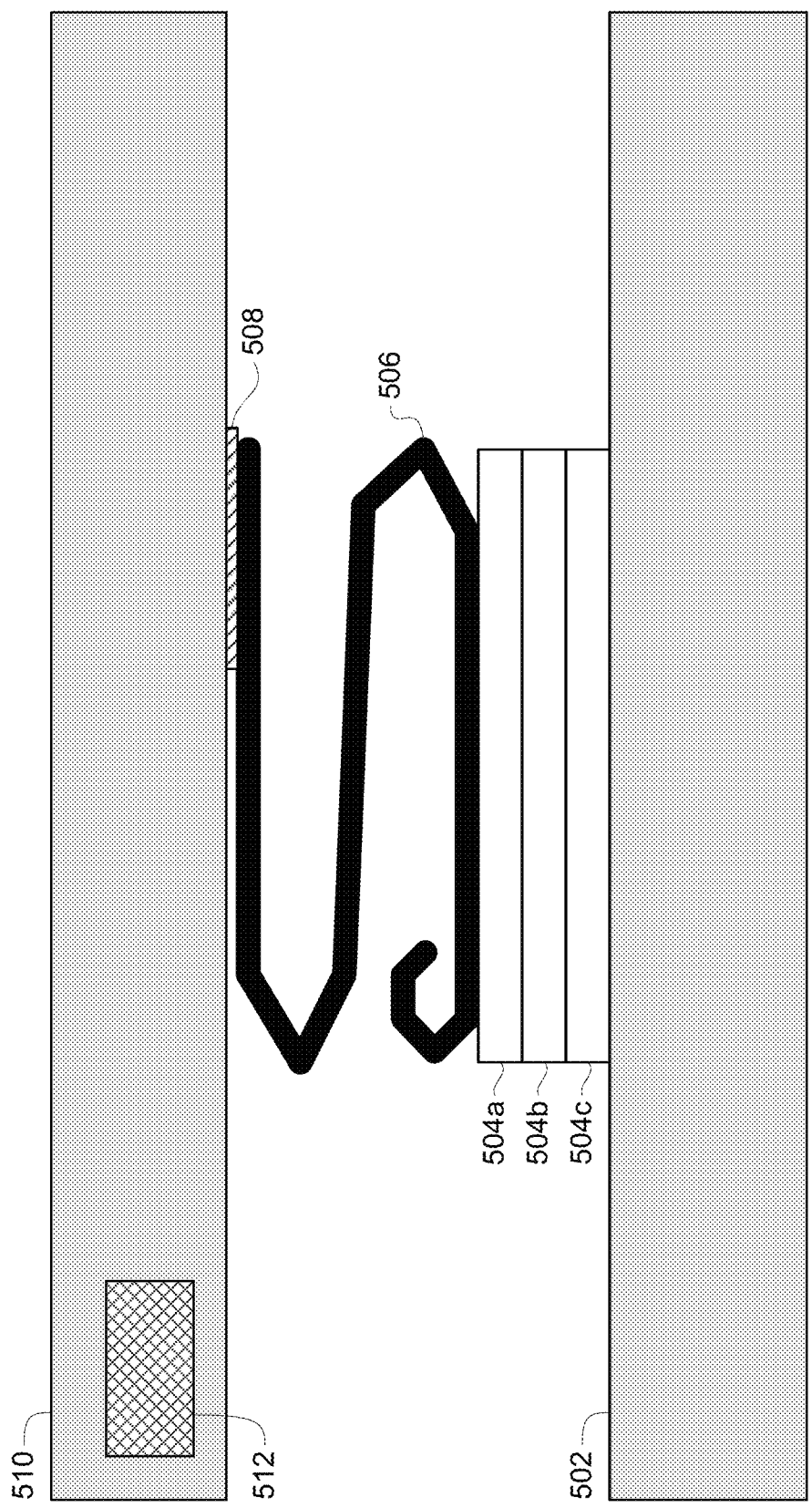
Figure 5C:
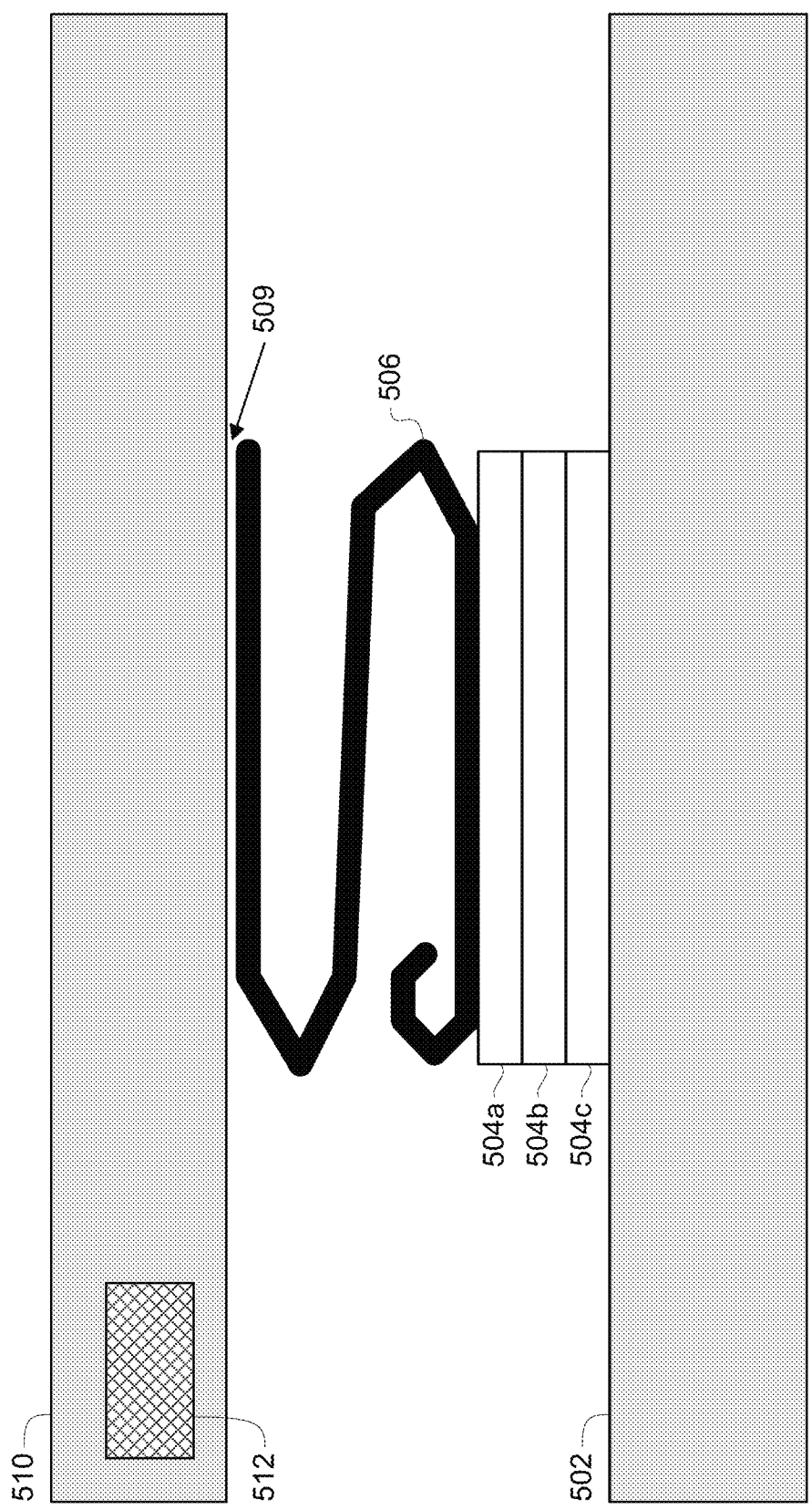
Figure 5D:
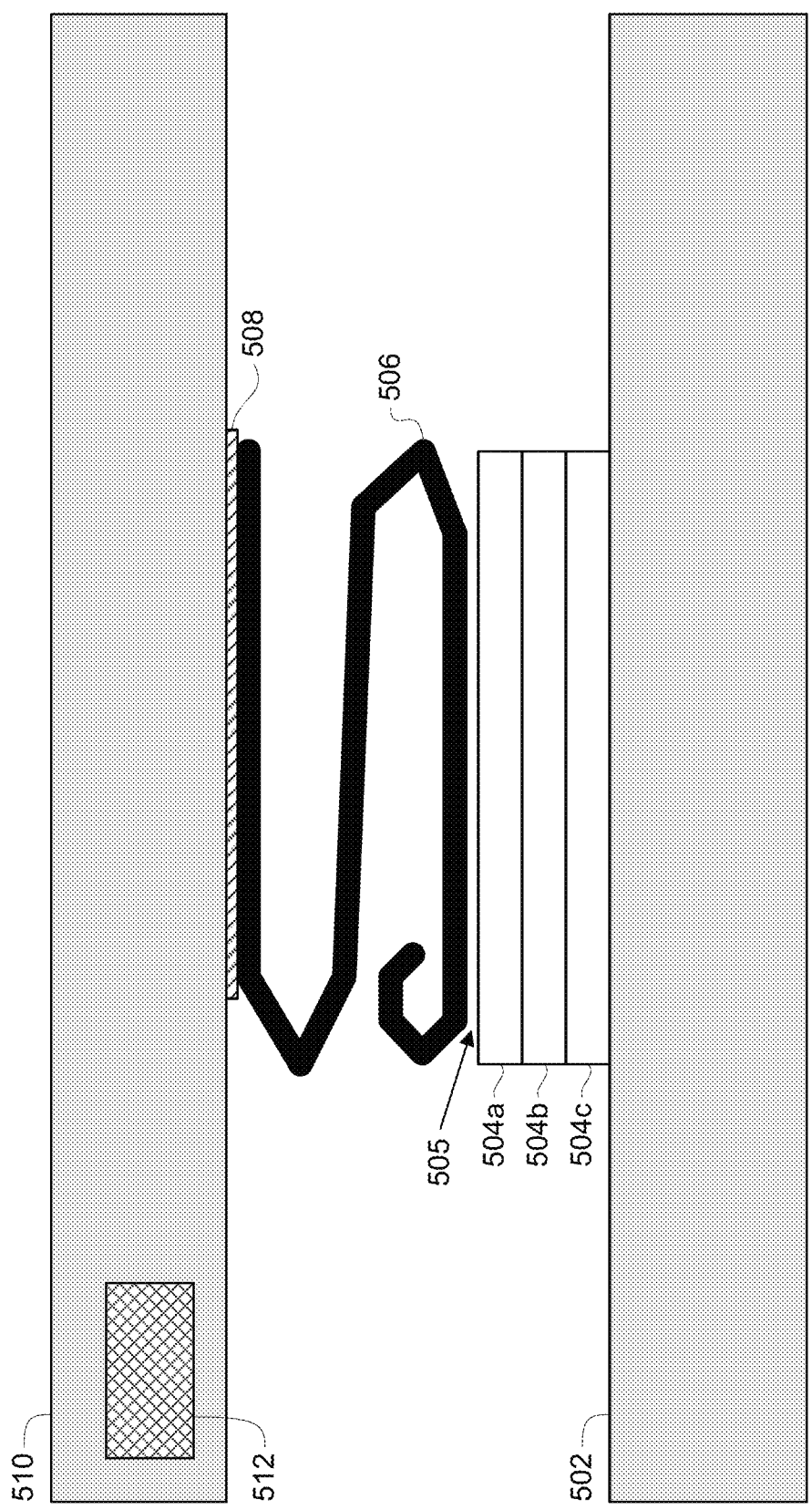

Although not shown, the example system shown in FIG. 5A may further include one or more processors (e.g., processor(s) 204 of computing device(s) 202 of FIG. 2, processor(s) 304 of computing device(s) 302 of FIG. 3A, processor(s) 354 of ECU 352 of FIG. 3B, the processors of one or more of computing devices 402, 404, 40, or 408 of FIG. 4B, etc.) configured to determine a state of the joint 508 based on vibrations sensed by the one or more vibration sensors 512. For example, based on the output of the one or more vibration sensors 512, the one or more processors may be configured to determine that the joint 508 is intact (e.g., as shown in FIG. 5A), partially broken (e.g., as shown in FIG. 5B), or fully broken (e.g., as shown in FIG. 5C). Likewise, in some aspects, the one or more processors may be configured to determine a state of contact between the second electrical contact 506 and the first electrical contact (e.g., the electrical element's top layer 504c) based on the vibrations sensed by the one or more vibration sensors 512. For example, the one or more processors may be configured to determine whether the second electrical contact 506 is pressing against at least a portion of the top layer 504c (e.g., as shown in FIGS. 5A-5C), or if it no longer touching the top layer 504c (e.g., as shown in FIG. 5D). In that regard, FIGS. 5B-5D each show different example states of the system of FIG. 5A. Thus, each of the reference numbers in common between FIGS. 5A-5D denote the same structures, and may be understood as described above.

FIG. 5B shows an example state 500-2 of the system of FIG. 5A in which joint 508 is partially broken. FIG. 5B simply illustrates one way in which joint 508 may be partially broken. As will be understood, there are many ways in which joint 508 may be partially broken, including ways that may not be readily apparent visually (e.g., as may be the case with a cracked solder joint). In some cases, where joint 508 is partially broken, the second electrical contact 506 may still be able to conduct electricity to the first electrical contact (e.g., the electrical element's top layer 504c), or may provide intermittent conductivity, which may prevent the breakage from being detected by simply monitoring electrical connectivity. However, as explained further below with respect to FIGS. 6 and 7A-7C, a partially broken joint 508 may nevertheless change the nature of the physical attachment between the second element 510 and the second electrical contact 506 such that there will be a change in the way vibrations propagate through the second element 510 and the second electrical contact 506. Thus, by monitoring the output of the one or more vibration sensors 512, it may be possible to identify that joint 508 has become partially broken. Advantageously, this may allow the partial breakage to be identified before it results in a full loss of electrical connection, and thus allow preventative maintenance to be performed before a full failure of joint 508 can occur.

FIG. 5C shows an example state 500-3 of the system of FIG. 5A in which joint 508 is fully broken, resulting in a gap 509 between the second electrical contact 506 and second element 510. In this example, electrical current will not flow from the second element 508 to the second electrical contact due to the breakage. Thus, this failure mode may be detectable by monitoring electrical connectivity. However, as there may be other failure modes (e.g., a failure within circuitry of second element 510, a failure between layers 504a-504c of the electrical element, the failure mode depicted in FIG. 5D, etc.), it still may not be possible to determine what caused the loss of electrical conductivity within the circuit without disassembling the system and performing targeted tests. On the other hand, by monitoring the output of the one or more vibration sensors 512, it may be possible to identify that joint 508 has become broken. Advantageously, this may allow the breakage to be identified from the outset, potentially expediting repair and lowering repair costs (e.g., those associated with needlessly replacing items not responsible for the failure).

FIG. 5D shows an example state 500-4 of the system of FIG. 5A in which the second electrical contact 506 has pulled away from the electrical element's top layer 504c, resulting in a gap 505 between the second electrical contact 506 and top layer 504c. This may result in many ways. For example, gap 505 may form as a result of the first element 502 moving away from the second element 510, as may occur if the first element 502 or the second element 510 is struck, damaged, warped, etc. Likewise, gap 505 may form as a result of the second electrical contact 506 being compressed to the point that it plastically deforms, and thus no longer contacts the top layer 504c when fully relaxed. Here as well, this failure mode may be detectable by monitoring electrical connectivity. However, as there may be other failure modes (e.g., a failure within circuitry of second element 510, a failure between layers 504a-504c of the electrical element, the failure mode depicted in FIG. 5C, etc.), it still may not be possible to determine what caused the loss of electrical conductivity within the circuit without disassembling the system and performing targeted tests. On the other hand, by monitoring the output of the one or more vibration sensors 512, it may be possible to identify that the second electrical contact 506 is no longer contacting the top layer 504c. Again, this may allow the breakage to be identified from the outset, potentially expediting repair and lowering repair costs (e.g., those associated with needlessly replacing items not responsible for the failure).

Example Methods

FIG. 6 sets forth an exemplary method 600 for monitoring a state of a spring contact, in accordance with aspects of the disclosure.

In step 602, one or more processors of a processing system (e.g., processor(s) 204 of computing device(s) 202 of FIG. 2, processor(s) 304 of computing device(s) 302 of FIG. 3A, processor(s) 354 of ECU 352 of FIG. 3B, the processors of one or more of computing devices 402, 404, 406, or 408 of FIG. 4B, etc.) monitor a plurality of outputs from one or more vibration sensors of an apparatus. In the example of FIG. 6, it is assumed that the apparatus comprises: a first element; a first electrical contact attached to the first element; a second element remote from the first element, the one or more vibration sensors being coupled to the second element; one or more operational sensors, the one or more operational sensors being configured to detect objects in an environment around the system via one or more operational wavelengths, wherein the first element is substantially transparent to the operational wavelengths of the one or more sensors; a second electrical contact, the second electrical contact being a spring contact configured to press against the second element and at least a portion of the first electrical contact; and a joint configured to attach a first portion of the second electrical contact to the second element.

The one or more processors may be configured to monitor the plurality of outputs from the one or more vibration sensors in any suitable way. For example, in some aspects of the technology, the one or more vibration sensors may be configured to provide vibration signal data in the time domain (similar to signal 702 of FIG. 7A) or the frequency domain (similar to that shown in FIG. 7I). The one or more processors may be configured to receive the vibration signal data and store it in memory (e.g., memory 206 of computing device(s) 202 of FIG. 2, memory 306 of computing device(s) 302 of FIG. 3A, memory 356 of ECU 352 of FIG. 3B, the memories of one or more of computing devices 402, 404, 406, or 408 of FIG. 4B, etc.). Likewise, in some aspects of the technology, the one or more processors may be configured to receive the vibration signal data and convert it from the frequency domain into the time domain (e.g., using a Fourier transform), or vice versa (e.g., using an inverse Fourier transform), and to then store the converted signal data in memory.

In step 604, the one or more processors determine, based on one or more outputs of the plurality of outputs and one or more reference values, a state of the joint and/or a state of contact between the second electrical contact and the first electrical contact. Any suitable set of reference values may be used in this regard. For example, in some aspects of the technology, the reference values may represent target amplitudes for particular frequencies, target amplitude ranges for particular frequencies, maximum amplitudes for particular frequencies, or minimum amplitudes for particular frequencies. In such a case, through initial testing in which the apparatus is exposed to vibration, it may be possible to generate a set of reference amplitudes or reference amplitude ranges for various frequencies that correlate to modes of interest (e.g., modes in which the spring contact is in working order, modes in which the joint has become fully or partially broken, modes in which the spring contact has pulled away from the first electrical contact, etc.). Likewise, in some aspects of the technology, the reference values may be based on one or more prior outputs of the vibration sensors taken during actual use. In such a case, the one or more processors may generate a set of reference amplitudes or reference amplitude ranges based on past outputs of the vibration sensors so that changes to the way the apparatus is resonating can be quickly identified. In either case, the one or more processors may be configured to determine based on those reference values whether the one or more outputs are characteristic of a particular mode. For example, in some aspects of the technology, the one or more processors may be configured to compare the one or more outputs of the vibration sensors to those reference values to determine if, for any frequency, the one or more outputs show that the apparatus is resonating at amplitudes above or below the reference amplitudes (or within or outside of a range of reference amplitudes). Again, the one or more processors may further be configured to process the one or more outputs of the vibration sensors (e.g., using a Fourier transform, inverse Fourier transform, using a normalizing factor, etc.) prior to making this determination.

Likewise, in some aspects of the technology, the reference values may represent reference vibration signals correlating to different modes of interest (e.g., modes in which the spring contact is in working order, modes in which the joint has become fully or partially broken, modes in which the spring contact has pulled away from the first electrical contact, etc.). For example, the one or more processors may be configured to compare vibration signals in the one or more outputs of the vibration, sensors to those reference vibration signals to determine a state of the joint and/or a state of contact between the second electrical contact and the first electrical contact, in such a case, the one or more processors may be configured to perform this comparison using a heuristic-based model or learned model configured to assess visual similarity between vibration signals. Likewise, in some examples, the one or more processors may be configured to use a heuristic-based or learned model that has been calibrated or trained (e.g., based on the reference vibration signals) to determine a state of the joint and/or a state of contact between the second electrical contact and the first electrical contact based on an input vibration signal. Here as well, the one or more processors may further be configured to process the one or more outputs of the vibration sensors (e.g., using a Fourier transform, inverse Fourier transform, a normalizing factor, etc.) prior to making this determination.

FIG. 7A illustrates an exemplary vibration signal plotted in the time domain, in accordance with aspects of the disclosure. In that regard, signal 702 is an example of one type of output that may be received from a vibration sensor (e.g., vibration sensor(s) 512). In this case, signal 702 has been plotted in the time domain, with the horizontal axis 704 representing time and the vertical axis 706 representing amplitude. In contrast, FIG. 7B shows the same vibration data as it might appear when plotted in the frequency domain, with the horizontal axis 710 representing frequency and the vertical axis 712 representing amplitude. As already noted, the time-domain data shown in FIG. 7A may be converted into the frequency-domain data shown in FIG. 7B using a Fourier transform. Likewise, the frequency-domain data shown in FIG. 7B may be converted into the time-domain data shown in FIG. 7A using an inverse Fourier transform.

As can be seen in FIG. 7B, the vibration data is characterized by three main frequency spikes 708a-708c. A change in the amplitude of any of these three main frequency spikes 708a-708c, or a change in the amplitude of another frequency (e.g., a change that results in a fourth frequency spike), may indicate a change in the physical structure to which the vibration sensors are attached. For example, where the vibration sensor is attached to a PC board (e.g., second element 510) with an attached spring contact (e.g., second electrical contact 506) that presses against another object (e.g., top layer 504a of a separate electrical element), the apparatus may generally resonate in such a way that the frequency spikes 708a-708c of FIG. 78 may be observed under normal conditions. However, if a joint (e.g., joint 508) between the spring contact and the PC board breaks (fully or partially) and/or if a gap (e.g., gap 505) forms between the spring contact and whatever other object it normally presses against, this may result in a change in the amplitude of one or more of frequency spikes 708a-708c, or the formation of one or more new spikes at different frequencies.

FIG. 7C illustrates an exemplary set of reference values plotted in the frequency domain, in accordance with aspects of the disclosure. Thus, like the frequency-domain plot of FIG. 7B, each of the reference values are plotted with the horizontal axis 716 representing frequency and the vertical axis 718 representing amplitude. FIG. 7C simply shows one potential way in which reference values may be represented. In this example, three frequencies are shown having a higher reference amplitude (frequency spikes 714a-714c), while all other frequencies have a lower reference amplitude (e.g., as shown in selected frequency spike 714d). Here again, these reference values may represent minimum amplitudes for each frequency, maximum amplitudes for each frequency, or target amplitudes for each frequency. As already explained, the reference values of FIG. 7C may be compared to actual values obtained from a vibration sensor (e.g., as shown in FIG. 7B) to determine if the actual values are indicative of one or more failure modes. For example, as frequency spike 708c of FIG. 7B has a higher amplitude than the corresponding reference amplitude of frequency spike 714c, one or more processors may be configured to determine that the vibrations shown in FIG. 7B are indicative of a failure.

Although the technology herein has been described with reference to particular embodiments, it is to be understood that these embodiments are merely illustrative of the principles and applications of the present technology. It is therefore to be understood that numerous modifications may be made to the illustrative embodiments and that other arrangements may be devised without departing from the spirit and scope of the present technology as defined by the appended claims.

The invention claimed is:

1. A system, comprising:
a first element;
a first electrical contact attached to the first element;
a second element remote from the first element;
one or more vibration sensors coupled to the second element;
a second electrical contact, the second electrical contact being a spring contact configured to press against the second element and at least a portion of the first electrical contact;
a joint configured to attach a first portion of the second electrical contact to the second element, wherein the joint is a component of a sensor assembly of an autonomous vehicle; and
one or more processors configured to determine a state of the joint based on vibrations from operation of the autonomous vehicle sensed in situ by the one or more vibration sensors.

2. The system of claim 1, further comprising the sensor assembly,
wherein the sensor assembly includes the first element, the first electrical contact, the second element, the one or more vibration sensors, the second electrical contact, and one or more operational sensors configured to detect objects in an environment around the autonomous vehicle via one or more operational wavelengths, and
wherein the first element is substantially transparent to the one or more operational wavelengths.

3. The system of claim 2, wherein the first element is a window of the one or more operational sensors.

4. The system of claim 3, wherein the first electrical contact is integrated with a heating element attached to the window.

5. The system of claim 2, wherein the one or more operational sensors include a camera.

6. The system of claim 2, wherein the one or more operational sensors include a lidar sensor.

7. The system of claim 1, wherein the one or more vibration sensors comprise at least one of an accelerometer, a strain gauge, or an acoustic vibration sensor.

8. The system of claim 1, wherein the second element is a printed circuit board.

9. The system of claim 1, wherein the joint comprises at least one of solder, a weld, or adhesive.

10. The system of claim 1, wherein the one or more processors being configured to determine the state of the joint includes being configured to determine that the joint is intact.

11. The system of claim 1, wherein the one or more processors being configured to determine the state of the joint includes being configured to determine that the joint is partially broken.

12. The system of claim 1, wherein the one or more processors being configured to determine the state of the joint includes being configured to determine that the joint is fully broken.

13. The system of claim 1, wherein the one or more processors are further configured to determine a state of contact between the second electrical contact and the first electrical contact based on vibrations sensed by the one or more vibration sensors.

14. The system of claim 13, wherein the one or more processors being configured to determine the state of contact includes being configured to determine that the second electrical contact is pressing against at least a portion of the first electrical contact.

15. The system of claim 13, wherein the one or more processors being configured to determine the state of contact includes being configured to determine that the second electrical contact is not pressing against any portion of the first electrical contact.

16. The system of claim 1, wherein the autonomous vehicle is a passenger vehicle.

17. The system of claim 1, wherein the autonomous vehicle is a cargo vehicle.

18. A computer-implemented method, comprising:
monitoring, using one or more processors of a processing system during operation of a sensor assembly of an autonomous vehicle, a plurality of outputs from one or more vibration sensors of the sensor assembly, the plurality of outputs being associated with vibrations resulting from operation of the sensor assembly as the autonomous vehicle drives, the sensor assembly including:
a first element;
a first electrical contact attached to the first element;
a second element remote from the first element, the one or more vibration sensors being coupled to the second element; a second electrical contact, the second electrical contact being a spring contact configured to press against the second element and at least a portion of the first electrical contact; and
a joint configured to attach a first portion of the second electrical contact to the second element; and
determining, using the one or more processors during the operation of the sensor assembly, a state of the joint based on one or more outputs of the plurality of outputs and one or more reference values.

19. The method of claim 18, wherein the sensor assembly further includes one or more operational sensors configured to detect objects in an environment around the autonomous vehicle via one or more operational wavelengths, and
wherein the first element is substantially transparent to the one or more operational wavelengths.

20. The method of claim 18, further comprising:
determining, using the one or more processors, a state of contact between the second electrical contact and the first electrical contact based on the one or more outputs of the plurality of outputs and one or more reference values.

21. The method of claim 20, wherein determining the state of contact includes determining whether the second electrical contact is pressing against any portion of the first electrical contact.

22. A computer-implemented method, comprising:
monitoring, in situ using one or more processors of a processing system, a plurality of outputs from one or more vibration sensors of a sensor assembly of an autonomous vehicle, the plurality of outputs being associated with vibrations resulting from operation of the sensor assembly as the autonomous vehicle drives, the sensor assembly including:
a first element;
a first electrical contact attached to the first element;
a second element remote from the first element, the one or more vibration sensors being coupled to the second element;
a second electrical contact, the second electrical contact being a spring contact configured to press against the second element and at least a portion of the first electrical contact; and
a joint configured to attach a first portion of the second electrical contact to the second element; and
determining, in situ using the one or more processors, a state of contact between the second electrical contact and the first electrical contact based on one or more outputs of the plurality of outputs and one or more reference values.

23. The method of claim 22, wherein the sensor assembly further includes one or more operational sensors configured to detect objects in an environment around the autonomous vehicle via one or more operational wavelengths, and
wherein the first element is substantially transparent to the one or more operational wavelengths.

* * * * *